US007156159B2

(12) United States Patent
Lovette et al.

(10) Patent No.: US 7,156,159 B2
(45) Date of Patent: Jan. 2, 2007

(54) MULTI-LEVEL MICROCHANNEL HEAT EXCHANGERS

(75) Inventors: James Lovette, Palo Alto, CA (US); Peng Zhou, Albany, CA (US); James Gill Shook, Santa Cruz, CA (US)

(73) Assignee: Cooligy, Inc., Mountain View, CA (US)

( * ) Notice: Subject to any disclaimer, the term of this patent is extended or adjusted under 35 U.S.C. 154(b) by 0 days.

(21) Appl. No.: 10/612,241

(22) Filed: Jul. 1, 2003

(65) Prior Publication Data
US 2004/0182548 A1    Sep. 23, 2004

Related U.S. Application Data

(60) Provisional application No. 60/455,729, filed on Mar. 17, 2003.

(51) Int. Cl.
*F28D 15/00*    (2006.01)
*F28F 3/00*    (2006.01)
*H05K 7/20*    (2006.01)

(52) U.S. Cl. .................. 165/104.33; 165/80.4; 165/143; 165/170

(58) Field of Classification Search ........... 165/80.4, 165/104.33, 104.34, 103, 135, 136, 139, 165/143, 168, 170, 174, 175; 361/699, 700; 257/714, 715
See application file for complete search history.

(56) References Cited

U.S. PATENT DOCUMENTS

| | | | |
|---|---|---|---|
| 0,596,062 A | 12/1897 | Firey | |
| 2,039,593 A | 5/1936 | Hubbuch et al. | |
| 2,273,505 A | 2/1942 | Florian | |
| 3,361,195 A * | 1/1968 | Motto, Jr. et al. | 165/80.4 |
| 3,771,219 A * | 11/1973 | Tuzi et al. | 438/461 |
| 3,817,321 A | 6/1974 | von Cube et al. | |
| 3,948,316 A | 4/1976 | Souriau | |
| 4,109,707 A | 8/1978 | Wilson et al. | |
| 4,211,208 A | 7/1980 | Lindner | |
| 4,312,012 A | 1/1982 | Frieser et al. | |
| 4,450,472 A | 5/1984 | Tuckerman et al. | |
| 4,467,861 A | 8/1984 | Kiseev et al. | |

(Continued)

FOREIGN PATENT DOCUMENTS

DE    197 10 716 C2    9/1998

(Continued)

OTHER PUBLICATIONS

Stephen C. Jacobson et al., "Fused Quartz Substrates for Microchip Electrophoresis", Analytical Chemistry, Vo. 67, No. 13, Jul. 1, 1995, pp. 2059-2063.

(Continued)

*Primary Examiner*—Tho Duong
(74) *Attorney, Agent, or Firm*—Haverstock & Owens LLP

(57) ABSTRACT

An apparatus and method of circulating a heat-absorbing material within a heat exchanger. The apparatus comprises a manifold layer coupled to an interface layer. The manifold layer comprises an inlet manifold and an outlet manifold. The interface layer comprises a plurality of channels that extend from the inlet manifold, toward a heat-exchanging plane, and turn away from the heat-exchanging plane, terminating at the outlet manifold. The plurality of channels are stacked in a plane non-parallel to the heat-exchanging plane. Each of the channels is adjacent to another, thus allowing heat radiated from a heat-generating device to be conducted to a cooling material circulating within the channels, away from the heat-generating device. Preferably, each of the channels has a U-shape or an elongated U-shape.

79 Claims, 12 Drawing Sheets

U.S. PATENT DOCUMENTS

| | | | |
|---|---|---|---|
| 4,485,429 A | 11/1984 | Mittal | |
| 4,494,171 A | 1/1985 | Bland et al. | 361/386 |
| 4,516,632 A | 5/1985 | Swift et al. | |
| 4,561,040 A | 12/1985 | Eastman et al. | |
| 4,567,505 A | 1/1986 | Pease et al. | |
| 4,573,067 A | 2/1986 | Tuckerman et al. | |
| 4,574,876 A | 3/1986 | Aid | |
| 4,644,385 A | 2/1987 | Nakanishi et al. | |
| 4,758,926 A | 7/1988 | Herrell et al. | |
| 4,866,570 A | 9/1989 | Porter | |
| 4,868,712 A | 9/1989 | Woodman | |
| 4,893,174 A | 1/1990 | Yamada et al. | |
| 4,894,709 A | 1/1990 | Phillips et al. | |
| 4,896,719 A | 1/1990 | O'Neill et al. | |
| 4,903,761 A | 2/1990 | Cima | |
| 4,908,112 A | 3/1990 | Pace | |
| 4,938,280 A | 7/1990 | Clark | |
| 5,009,760 A | 4/1991 | Zare et al. | |
| 5,016,090 A * | 5/1991 | Galyon et al. | 257/714 |
| 5,016,138 A | 5/1991 | Woodman | |
| 5,043,797 A | 8/1991 | Lopes | |
| 5,057,908 A | 10/1991 | Weber | |
| 5,070,040 A | 12/1991 | Pankove | |
| 5,083,194 A | 1/1992 | Bartilson | |
| 5,088,005 A | 2/1992 | Ciaccio | |
| 5,099,311 A * | 3/1992 | Bonde et al. | 165/80.4 |
| 5,099,910 A | 3/1992 | Walpole et al. | |
| 5,125,451 A | 6/1992 | Matthews | |
| 5,131,233 A | 7/1992 | Cray et al. | |
| 5,145,001 A | 9/1992 | Valenzuela | 165/164 |
| 5,161,089 A | 11/1992 | Chu et al. | |
| 5,179,500 A | 1/1993 | Koubek et al. | 361/385 |
| 5,203,401 A | 4/1993 | Hamburgen et al. | |
| 5,218,515 A | 6/1993 | Bernhardt | |
| 5,228,502 A | 7/1993 | Chu et al. | |
| 5,232,047 A | 8/1993 | Matthews | |
| 5,239,200 A | 8/1993 | Messina et al. | |
| 5,239,443 A | 8/1993 | Fahey et al. | |
| 5,263,251 A | 11/1993 | Matthews | |
| 5,265,670 A | 11/1993 | Zingher | |
| 5,269,372 A | 12/1993 | Chu et al. | |
| 5,274,920 A * | 1/1994 | Matthews | 29/890.039 |
| 5,275,237 A | 1/1994 | Rolfson et al. | |
| 5,309,319 A * | 5/1994 | Messina | 361/699 |
| 5,310,440 A | 5/1994 | Zingher | |
| 5,316,077 A | 5/1994 | Reichard | |
| 5,317,805 A | 6/1994 | Hoopman et al. | |
| 5,325,265 A | 6/1994 | Turlik et al. | |
| 5,346,000 A | 9/1994 | Schlitt | |
| 5,380,956 A | 1/1995 | Loo et al. | |
| 5,383,340 A | 1/1995 | Larson et al. | |
| 5,386,143 A | 1/1995 | Fitch | |
| 5,388,635 A | 2/1995 | Gruber et al. | |
| 5,417,280 A | 5/1995 | Hayashi et al. | |
| 5,427,174 A | 6/1995 | Lomolino, Sr. et al. | |
| 5,436,793 A | 7/1995 | Sanwo et al. | |
| 5,459,099 A | 10/1995 | Hsu | |
| 5,490,117 A | 2/1996 | Oda et al. | |
| 5,508,234 A | 4/1996 | Dusablon, Sr. et al. | |
| 5,514,832 A | 5/1996 | Dusablon, Sr. et al. | |
| 5,514,906 A | 5/1996 | Love et al. | |
| 5,544,696 A | 8/1996 | Leland | |
| 5,548,605 A | 8/1996 | Benett et al. | |
| 5,564,497 A * | 10/1996 | Fukuoka et al. | 165/152 |
| 5,575,929 A | 11/1996 | Yu et al. | |
| 5,585,069 A | 12/1996 | Zanzucchi et al. | |
| 5,641,400 A | 6/1997 | Kaltenbach et al. | |
| 5,658,831 A | 8/1997 | Layton et al. | |
| 5,675,473 A * | 10/1997 | McDunn et al. | 361/699 |
| 5,692,558 A | 12/1997 | Hamilton et al. | |
| 5,696,405 A | 12/1997 | Weld | |
| 5,727,618 A | 3/1998 | Mundinger et al. | |
| 5,740,013 A | 4/1998 | Roesner et al. | |
| 5,763,951 A | 6/1998 | Hamilton et al. | |
| 5,768,104 A | 6/1998 | Salmonson et al. | |
| 5,774,779 A | 6/1998 | Tuchinskiy | |
| 5,800,690 A | 9/1998 | Chow et al. | |
| 5,801,442 A * | 9/1998 | Hamilton et al. | 257/714 |
| 5,810,077 A * | 9/1998 | Nakamura et al. | 165/153 |
| 5,835,345 A | 11/1998 | Staskus et al. | |
| 5,858,188 A | 1/1999 | Soane et al. | |
| 5,863,708 A | 1/1999 | Zanzucchi et al. | |
| 5,870,823 A | 2/1999 | Bezama et al. | |
| 5,874,795 A | 2/1999 | Sakamoto | |
| 5,880,524 A | 3/1999 | Xie | |
| 5,901,037 A | 5/1999 | Hamilton et al. | |
| 5,921,087 A | 7/1999 | Bhatia et al. | |
| 5,936,192 A | 8/1999 | Tauchi | |
| 5,945,217 A | 8/1999 | Hanrahan | |
| 5,964,092 A | 10/1999 | Tozuka et al. | |
| 5,965,001 A | 10/1999 | Chow et al. | |
| 5,978,220 A | 11/1999 | Frey et al. | |
| 5,993,750 A | 11/1999 | Ghosh et al. | |
| 5,997,713 A | 12/1999 | Beetz, Jr. et al. | |
| 5,998,240 A | 12/1999 | Hamilton et al. | |
| 6,007,309 A | 12/1999 | Hartley | |
| 6,019,165 A | 2/2000 | Batchelder | |
| 6,034,872 A | 3/2000 | Chrysler et al. | |
| 6,039,114 A | 3/2000 | Becker et al. | |
| 6,054,034 A | 4/2000 | Soane et al. | |
| 6,068,752 A | 5/2000 | Dubrow et al. | |
| 6,090,251 A | 7/2000 | Sundberg et al. | |
| 6,096,656 A | 8/2000 | Matzke et al. | |
| 6,100,541 A | 8/2000 | Nagle et al. | |
| 6,101,715 A | 8/2000 | Fuesser et al. | |
| 6,119,729 A | 9/2000 | Oberholzer et al. | |
| 6,126,723 A | 10/2000 | Drost et al. | |
| 6,129,145 A | 10/2000 | Yamamoto et al. | |
| 6,131,650 A | 10/2000 | North et al. | |
| 6,140,860 A | 10/2000 | Sandhu et al. | |
| 6,146,103 A | 11/2000 | Lee et al. | |
| 6,159,353 A | 12/2000 | West et al. | |
| 6,167,948 B1 | 1/2001 | Thomas | |
| 6,174,675 B1 | 1/2001 | Chow et al. | |
| 6,176,962 B1 | 1/2001 | Soane et al. | |
| 6,186,660 B1 | 2/2001 | Kopf-Sill et al. | |
| 6,196,307 B1 | 3/2001 | Ozmat | 165/185 |
| 6,206,022 B1 | 3/2001 | Tsai et al. | |
| 6,210,986 B1 | 4/2001 | Arnold et al. | |
| 6,216,343 B1 | 4/2001 | Leland et al. | |
| 6,221,226 B1 | 4/2001 | Kopf-Sill | |
| 6,234,240 B1 | 5/2001 | Cheon | |
| 6,238,538 B1 | 5/2001 | Parce et al. | |
| 6,253,832 B1 | 7/2001 | Hallefalt | |
| 6,253,835 B1 | 7/2001 | Chu et al. | |
| 6,257,320 B1 | 7/2001 | Wargo | |
| 6,301,109 B1 | 10/2001 | Chu et al. | |
| 6,313,992 B1 | 11/2001 | Hildebrandt | |
| 6,317,326 B1 | 11/2001 | Vogel et al. | |
| 6,321,791 B1 | 11/2001 | Chow | |
| 6,322,753 B1 | 11/2001 | Lindberg et al. | |
| 6,324,058 B1 | 11/2001 | Hsiao | |
| 6,330,907 B1 | 12/2001 | Ogushi et al. | |
| 6,336,497 B1 | 1/2002 | Lin | |
| 6,337,794 B1 | 1/2002 | Agonafer et al. | |
| 6,351,384 B1 | 2/2002 | Daikoku et al. | |
| 6,366,462 B1 | 4/2002 | Chu et al. | |
| 6,366,467 B1 | 4/2002 | Patel et al. | |
| 6,367,544 B1 | 4/2002 | Calaman | |
| 6,388,317 B1 | 5/2002 | Reese | |
| 6,397,932 B1 | 6/2002 | Calaman et al. | |
| 6,400,012 B1 | 6/2002 | Miller et al. | |
| 6,406,605 B1 | 6/2002 | Moles | |
| 6,415,860 B1 | 7/2002 | Kelly et al. | |

| | | | |
|---|---|---|---|
| 6,417,060 B1 | 7/2002 | Tavkhelidze et al. | |
| 6,424,531 B1 | 7/2002 | Bhatti et al. | |
| 6,431,260 B1 | 8/2002 | Agonafer et al. | |
| 6,437,981 B1* | 8/2002 | Newton et al. | 361/700 |
| 6,438,984 B1 | 8/2002 | Novotny et al. | |
| 6,443,222 B1 | 9/2002 | Yun et al. | |
| 6,444,461 B1 | 9/2002 | Knapp et al. | |
| 6,457,515 B1 | 10/2002 | Vafai et al. | |
| 6,459,581 B1 | 10/2002 | Newton et al. | |
| 6,466,442 B1 | 10/2002 | Lin | |
| 6,477,045 B1* | 11/2002 | Wang | 361/700 |
| 6,492,200 B1* | 12/2002 | Park et al. | 438/113 |
| 6,508,301 B1 | 1/2003 | Marsala | 165/80.4 |
| 6,519,151 B1 | 2/2003 | Chu et al. | |
| 6,533,029 B1 | 3/2003 | Phillips | |
| 6,536,516 B1 | 3/2003 | Davies et al. | |
| 6,537,437 B1 | 3/2003 | Galambos et al. | |
| 6,543,521 B1 | 4/2003 | Sato et al. | |
| 6,553,253 B1 | 4/2003 | Chang | |
| 6,578,626 B1* | 6/2003 | Calaman et al. | 165/80.4 |
| 6,581,388 B1 | 6/2003 | Novotny et al. | |
| 6,587,343 B1 | 7/2003 | Novotny et al. | |
| 6,588,498 B1 | 7/2003 | Reysin et al. | |
| 6,591,625 B1 | 7/2003 | Simon | |
| 6,600,220 B1 | 7/2003 | Barber et al. | |
| 6,601,643 B1 | 8/2003 | Cho et al. | |
| 6,606,251 B1 | 8/2003 | Kenny, Jr. et al. | |
| 6,609,560 B1 | 8/2003 | Cho et al. | |
| 6,632,655 B1 | 10/2003 | Mehta et al. | |
| 6,632,719 B1 | 10/2003 | DeBoer et al. | 438/381 |
| 6,651,735 B1 | 11/2003 | Cho et al. | |
| 6,729,383 B1 | 5/2004 | Cannell et al. | |
| 6,743,664 B1 | 6/2004 | Liang et al. | |
| 2001/0016985 A1 | 8/2001 | Insley et al. | |
| 2001/0024820 A1 | 9/2001 | Mastromatteo et al. | |
| 2001/0045270 A1 | 11/2001 | Bhatti | |
| 2001/0046703 A1 | 11/2001 | Burns et al. | |
| 2002/0075645 A1 | 6/2002 | Kitano et al. | |
| 2002/0121105 A1 | 9/2002 | McCarthy, Jr. et al. | |
| 2003/0062149 A1 | 4/2003 | Goodson et al. | |
| 2003/0121274 A1 | 7/2003 | Wightman | |
| 2003/0213580 A1 | 11/2003 | Philpott et al. | |
| 2004/0040695 A1 | 3/2004 | Chesser et al. | |
| 2004/0052049 A1 | 3/2004 | Wu et al. | |
| 2004/0089008 A1 | 5/2004 | Tilton et al. | |
| 2004/0112571 A1 | 6/2004 | Kenny et al. | 165/80.3 |
| 2004/0125561 A1 | 7/2004 | Gwin et al. | |
| 2004/0160741 A1 | 8/2004 | Moss et al. | |
| 2004/0188069 A1 | 9/2004 | Tomioka et al. | |
| 2005/0168949 A1 | 8/2005 | Tilton et al. | 361/699 |

FOREIGN PATENT DOCUMENTS

| | | |
|---|---|---|
| JP | 1-256775 | 10/1989 |
| JP | 10-99592 | 4/1998 |
| JP | 2001-326311 | 11/2001 |
| WO | WO 01/25711 A1 | 4/2001 |

OTHER PUBLICATIONS

Kendra V. Sharp et al., "Liquid Flows in Microchannels", 2002, vol. 6, pp. 6-1 to 6-38.

Shuchi Shoji et al., "Microflow devices and systems", J. Microech. Microeng. 4 (1994), pp. 157-171, printed in the U.K.

Angela Rasmussen et al., "Fabrication Techniques to Realize CMOS-Compatible Microfluidic Microchannels", Journal of Microelectromechanical, Vo. 10, No. 2, Jun. 2001, pp. 286-297.

Gad Hetsroni et al., "Nonuniform Temperature Distribution in Electronic Devices Cooled by Flow in Parallel Microchannels", IEEE Transactions on Components and Packaging Technologies, Mar. 2001, vol. 24, No. 1, pp. 16-23.

X. F. Peng et al., "Heat Transfer Characteristics of Water Flowing through Microchannels", Experimental Heat Transfer An International Journal, vol. 7, No. 4, Oct.-Dec. 1994, pp. 265-283.

Linan Jiang et al., "Forced Convection Boiling in a Microchannel Heat Sink", Journal of Microelectromechanical Systems, vol. 10, No. 1, Mar. 2001, pp. 80-87.

Muhammad M. Rahman et al., "Experimental Measurements of Fluid Flow and Heat Transfer in Microchannel Cooling Passages in a Chip Substrate", 1993, EEP-vol. 4-2, Advances in Electronic Packages, pp. 685-692.

X. F. Peng et al., "Forced convection and flow boiling heat transfer for liquid flowing through Microchannels", 1993, Int. J. Heat Mass Transfer, vol. 36, No. 14, pp. 3421-3427.

Lung-Jieh Yang et al., "A Micro Fluidic System of Micro Channels with On-Site Sensors by Silicon Bulk Micromaching", Sep. 1999, Microfluidic Devices and Systems II, vol. 3877, pp. 267-272.

G. Mohiuddin Mala et al., "Heat transfer and fluid flow in microchannels", 1997, Int. J. Mass transfer, vol. 40, No. 13, pp. 3079-3088, printed in Great Britain.

J. M. Cuta et al., "Fabrication and Testing of Micro-Channel Heat Exchangers", SPIE Microlithography and Metrology in Micromaching, vol. 2640, 1995, pp. 152-160.

Linan Jiang et al., "A Micro-Channel Heat Sink with Integrated Temperature Sensors for Phase Transition Study", 1999, 12th IEEE International Conference on Micro Electro Mechanical Systems, pp. 159-164.

Linan Jiang et al., "Fabrication and characterization of a microsystem for a micro-scale heat transfer study", J. Micromech. Microeng. 9 (1999) pp. 422-428, printed in the U.K.

M. B. Bowers et al., "High flux boiling in low flow rate, low pressure drop mini-channel and micro-channel heat sinks", 1994, Int. J. Heat Mass Transfer, vol. 37, No. 2, pp. 321-332.

Yongendra Joshi, "Heat out of small packages", Dec. 2001, Mechanical Engineer, pp. 56-58.

A. Rostami et al., "Liquid Flow and Heat Transfer in Microchannels: a Review", 2000, Heat and Technology, vol. 18, No. 2, pp. 59-68.

Lian Zhang et al., "Measurements and Modeling of Two-Phase Flow in Microchannels with Nearly Constant Heat Flux Boundary Conditions", Journal of Microelectromechanical Systems, vol. 11, No. 1, Feb. 2002, pp. 12-19.

Muhammad Mustafizur Rahman, "Measurements of Heat Transfer in Microchannel Heat Sinks", Int. Comm. Heat Mass Transfer, vol. 27, No. 4, May 2000, pp. 495-506.

Issam Mudawar et al., "Enhancement of Critical Heat Flux from High Power Microelectronic Heat Sources in a Flow Channel", Journal of Electronic Packaging, Sep. 1990, vol. 112, pp. 241-248.

Nelson Kuan, "Experimental Evaluation of Micro Heat Exchangers Fabricated in Silicon", 1996, HTD-vol. 331, National Heat Transfer Conference, vol. 9, pp. 131-136.

E. W. Kreutz et al., "Simulation of micro-channel heat sinks for optoelectronic microsystems", Microelectronics Journal 31(2000) pp. 787-790.

J. C. Y. Koh et al., "Heat Transfer of Microstructure for Integrated Circuits", 1986, Int. Comm. Heat Mass Transfer, vol. 13, pp. 89-98.

Snezana Konecni et al., "Convection Cooling of Microelectronic Chips", 1992, InterSociety Conference on Thermal Phenomena, pp. 138-144.

Michael B. Kleiner et al., "High Performance Forced Air Cooling Scheme Employing Microchannel Heat Exchangers", 1995, IEEE Transactions on Components, Packaging, and Manufacturing Technology-Part A, vol. 18, No. 4, pp. 795-804.

Jerry K. Keska Ph. D. et al., "An Experimental Study on an Enhanced Microchannel Heat Sink for Microelectronics Applications", EEP-vol. 26-2, Advances in Electronic Packaging, 1999, vol. 2, pp. 1235-1259.

Shung-Wen Kang et al., "The Performance Test and Analysis of Silicon-Based Microchannel Heat Sink", Jul. 1999, Terahertz and Gigahertz Photonics, vol. 3795, pp. 259-270.

Joseph C. Tramontana, "Semiconductor Laser Body Heat Sink", Xerox Disclosure Journal, vol. 10, No. 6, Nov./Dec. 1985, pp. 379-381.

Sarah Arulanandam et al., "Liquid transport in rectangular microchannels by electroosmotic pumping", Colloid and Surfaces A: Physicochemical and Engineering Aspects 161 (2000), pp. 89-102.

Jeffery D. Barner et al., "Thermal Ink Jet Print Head Carriage with Integral Liquid Cooling Capabilities", Xerox Disclosure Journal-vol. 21, No. 1, Jan./Feb. 1996, pp. 33-34.

"Autonomous displacement of a solution in a microchannel by another solution", Research Disclosure, Jun. 2001, pp. 1046-1047.

John M. Waldvogel, "Aluminum Silicon Carbide Phase Change Heat Spreader", Motorola, Jun. 1999, Technical Developments, pp. 226-230.

James P. Slupe et al., "An idea for maintaining a stable thermal environment for electronic devices", Research Disclosure, Aug. 2001, pp. 1312.

John M. Waldvogel, "A Heat Transfer Enhancement Method for Forced Convection Bonded-Fin Heatsinks", Motorola, Dec. 1997, Technical Developments, pp. 158-159.

"Thin Heat Pipe for Cooling Components on Printed Circuit Boards", IBM Technical Disclosure Bulletin, vol. 34, No. 7B, Dec. 1991, pp. 321-322.

"Integrally Grooved Semiconductor Chip and Heat Sink", Oct. 1971, IBM Technical Disclosure Bulletin, vol. 14, No. 5, p. 1425.

"Cold Plate for Thermal Conduction Module with Inlet for Cooling Water Near Highest Power Chips", IBM Technical Disclosure Bulletin, vol. 30, No. 5, Oct. 1987, p. 413.

"Circuit Module Cooling with Coaxial Bellow Providing Inlet, Outlet and Redundant Connections to Water-Cooled Element", IBM Technical Bulletin, vol. 30, No. 5, Oct. 1987, pp. 345-347.

"Piping System with Valves Controlled by Processor for Heating Circuit Modules in a Selected Temperature Profile for Sealing Integrity Test Under Temperature Stress", IBM Technical Disclosure Bulletin, vol. 30, No. 5, Oct. 1987, p. 336.

"Cooling System for Chip Carrier on Card", IBM Technical Disclosure Bulletin, vol. 31, No. 4, Sep. 1988, pp. 39-40.

"Chip Cooling Device", IBM Technical Disclosure Bulletin, vol. 30, No. 9, Feb. 1988, pp. 435-436.

W. E. Ahearn et al., "Silicon Heat Sink Method to Control Integrated Circuit Chip Operating Temperatures", IBM Technical Disclosure Bulletin, vol. 21, No. 8, Jan. 1979, pp. 3378-3380.

N. P. Bailey et al., "Cooling Device for Controlled Rectifier", IBM Technical Disclosure Bulletin, vol. 21, No. 11, Apr. 1979, pp. 4609-4610.

W. J. Kleinfelder et al., "Liquid-Filled Bellows Heat Sink", IBM Technical Disclosure Bulletin, vol. 21, No. 10, Mar. 1979, pp. 4125-4126.

R. P. Chrisfield et al., "Distributed Power/Thermal Control", IBM Technical Disclosure Bulletin, vol. 22, No. 3, Aug. 1979, pp. 1131-1132.

A. J. Arnold et al., "Heat Sink Design for Cooling Modules in a Forced Air Environment", IBM Technical Disclosure Bulletin, vol. 22, No. 6, Nov. 1979, pp. 2297-2298.

A. J. Arnold, "Structure for the Removal of Heat from an Integrated Circuit Module", IBM Technical Disclosure Bulletin, vol. 22, No. 6, Nov. 1979, pp. 2294-2296.

U. P. Hwang et al., "Cold Plate for Thermal Conduction Module with Improved Flow Pattern and Flexible Base", IBM Technical Disclosure Bulletin, vol. 25, No. 9, Feb. 1983, p. 4517.

K. C. Gallagher et al., "Cooling System for Data Processor with Flow Restricter in Secondary Loop to Limit Bypass-Cooling Water Flow", IBM Technical Disclosure Bulletin, vol. 26, No. 5, Oct. 1983, p. 2658.

R. C. Chu et al., "Silicon Heat Sink for Semiconductor Chip", IBM Technical Disclosure Bulletin, vol. 24, No. 11A, Apr. 1982, p. 5743.

J.M. Eldridge et al., "Heat-Pipe Vapor Cooling Etched Silicon Structure", IBM Technical Disclosure Bulletin, vol. 25, No. 8, Jan. 1983, pp. 4118-4119.

J. R. Skobern, "Thermoelectrically Cooled Module", IBM Technical Disclose Bulletin, vol. 27, No. 1A, Jun. 1984, p. 30.

M. J. Brady et al., "Etched Silicon Integrated Circuit Heat Sink", IBM Technical Disclosure Bulletin, vol. 27, No. 1B, Jun. 1984, p. 627.

H. D. Edmonds et al., "Heat Exchange Element for Semiconductor Device Cooling", IBM Technical Disclosure Bulletin, vol. 23, No. 3, Aug. 1980, p. 1057.

R. W. Noth, "Heat Transfer from Silicon Chips and Wafers", IBM Technical Disclosure Bulletin, vol. 17, No. 12, May 1975, p. 3544.

"Forced Boiling Cooling System with Jet Enhancement for Crititical Heat Flux Extension", IBM Technical Disclosure Bulletin, vol. 39, No. 10, Oct. 1996, p. 143.

"Miniature Heat Exchanger for Corrosive Media", IBM Technical Disclosure Bulletin, vol. 38, No. 01, Jan. 1995, pp. 55-56.

"Self-Contained Active Heat Dissipation Device", IBM Technical Disclosure Bulletin vol. 39, No. 04, Apr. 1996, pp. 115-116.

B. J. Ronkese, "Centerless Ceramic Package with Directly Connected Heat Sink", IBM Technical Disclosure Bulletin, vol. 20, No. 9, Feb. 1978, pp. 3577-3578.

K. S. Sachar, "Liquid Jet Cooling of Integrated Circuit Chips", vol. 20, No. 9, Feb. 1978, pp. 3727-3728.

A. H. Johnson, "Device Cooling", IBM Technical Disclosure Bulletin, vol. 20, No. 10, Mar. 1978, pp. 3919-3920.

A. L. Pacuzzo et al., "Integrated Circuit Module Package Cooling Structure", IBM Technical Disclosure Bulletin, vol. 20, No. 10, Mar. 1978, pp. 3898-3899.

R. D. Durand et al., "Flexible Thermal Conductor for Electronic Module", IBM Technical Disclosure Bulletin, vol. 20, No. 11A, Apr. 1978, p. 4343.

D. Balderes et al., "Liquid Cooling of a Multichip Module Package", IBM Technical Disclosure Bulletin, vol. 20, No. 11A, Apr. 1978, pp. 4336-4337.

J. A. Dorler et al., "Temperature Triggerable Fluid Coupling System for cooling Semiconductor Dies", IBM Technical Disclosure Bulletin, vol. 20, No. 11A, Apr. 1978, pp. 4386-4388.

V. W. Antonetti et al., "Integrated Module Heat Exchanger", IBM Technical Disclosure Bulletin, vol. 20, No. 11A, Apr. 1978, p. 4498.

P. Hwang et al., "Conduction Cooling Module", IBM Technical Disclosure Bulletin, vol. 20, No. 11A, Apr. 1978, pp. 4334-4335.

A. J. Arnold, "Electronic Packaging Structure", IBM Technical Disclosure Bulletin, vol. 20, No. 11B, Apr. 1978, pp. 4820-4822.

V. Y. Doo et al., "High Performance Package for Memory", IBM Technical Disclosure Bulletin, vol. 21, No. 2, Jul. 1978, pp. 585-586.

"Multi-Chip Package with Cooling by a Spreader Plate in Contact with a Chip having Cylindrical Holes Mating with an Inverse Frame Providing Water Flow Within its Pins", IBM Technical Disclosure Bulletin, vol. 31, No. 5, Oct. 1988, pp. 141-142.

J. Landrock et al., "Cooling System for Semiconductor Chips", IBM Technical Disclosure Bulletin, vol. 23, No. 4, Sep. 1980, p. 1483.

"Circuit Module Cooling with Multiple Pistons Contacting a Heat Spreader/Electrical Buffer Plate in Contact with Chip", IBM Technical Disclosure Bulletin, vol. 31, No. 12, May 1989, p. 5-7.

"TCM-LIKE Circuit Module with Local Heat Sink Resting on Chip and Chip Separated From Coolant by Bellows with Pins and Deflector Plate Attached to Local Heat Sink and Extending Above Bellows into Region of Coolant Flow", IBM Technical Disclosure Bulletin, vol. 31, No. 11, pp. 305-306.

"Water-Cooled Circuit Module with Grooves Forming Water Passages Near Heat-Producing Devices", IBM Technical Disclosure Bulletin, vol. 31, No. 12, May 1989, pp. 49-50.

"Cold Plate for Thermal conduction Module with Only Peripheral Mounting bolts, Large Surface Area Fin Inserts and Reduced Water Flow and Thermal Resistances", IBM Technical Disclosure Bulletin, vol. 31, No. 12, May 1989, p. 59.

"Thermal Control Hardware for Accelerated Run-In Testing of Multi-Chip Modules", IBM Technical Disclosure Bulletin, vol. 32, No. 5A, Oct. 1989, p. 129-130.

"Means of Removing More Heat From a TCM (Or Other Liquid-Cooled Logic Package) By Reducing the Coolant Temperature", IBM Technical Disclosure Bulletin, vol. 32 No. 5A, Oct. 1989, pp. 153-154.

E.G. Loeffel et al., "Liquid Cooled Module with Compliant Membrane", IBM Technical Disclosure Bulletin, vol. 20, No. 2, Jul. 1977, pp. 673-674.

V. Y. Doo et al., "Method of Effective Cooling of a High Power Silicon Chip", IBM Technical Disclosure Bulletin, vol. 20, No. 4, Sep. 1977, pp. 1436-1437.

V.Y. Doo et al., Semiconductor Chip Cooling Package, IBM Technical Disclosure Bulletin, vol. 20, No. 4, Sep. 1977, pp. 1440-1441.

"Heat Sink Fabrication Method", IBM Technical Disclosre Bulletin, vol. 27, No. 10A, Mar. 1985, p. 5656-5657.

"Thermal Conduction Module with Liquid Dielectric and Pistons with Surface Treatment for Enhanced Nucleate Boiling", IBM Technical Disclosure Bulletin, vol. 27, No. 12, May 1985, p. 6904.

"Pin Fin Array Heat Pipe Apparatus", IBM Technical Disclosure Bulletin, vol. 37, No. 09, Sep. 1994, p. 171.

Youngcheol Joo et al., "Fabrication of Monolithic Microchannels for IC Chip Cooling", 1995, IEEE Micro Electro Mechanical Systems, pp. 362-367.

Haim H. Bau, *Optimization of Conduits' shape in micro heat exchangers*, Dec. 10, 1997, International Journal of Heat and Mass Transfer 41 (1998), pp. 2717-2723.

V. K. Dwivedi et al., *Fabrication of very smooth walls and bottoms of silicon microchannels for heat dissipation of semiconductor devices*, Jan. 25, 2000, Microelectronics Journal 31 (2000), pp. 405-410.

Meint J. de Boer et al., *Micromachining of Buried Micro Channels in Silicon*, Mar. 2000, Journal of Microelectromechanical systems, vol. 9, No. 1, pp. 94-103.

S. F. Choquette, M. Faghri et al., *Optimum Design Of Microchannel Heat Sinks*, 1996, DSC-vol. 59, Microelectromechanical Systems (MEMS), ASME 1996, pp. 115-126.

David Copeland et al., *Manifold Microchannel Heat Sinks: Theory And Experiment*, 1995, EEP-vol. 10-2, Advances in Electronic Packaging ASME 1995, pp. 829-835.

J. M. Cuta et al., *Forced Convection Heat Transfer In Parallel Channel Array Microchannel Heat Exchanger*, 1996, PID-vol. 27/HTD-vol. 338, Advances in Energy efficiency, Heat/Mass Transfer Enhancement, ASME 1996, pp. 17-23.

K. Fushinobu et al., *Heat Generation and Transport in Sub-Micron Semiconductor Devices*, 1993, HTD-vol. 253, Heat Transfer on the Microscale, ASME 1993, pp. 21-28.

Charlotte Gillot et al., *Intefrated Micro Heat Sink for Power Multichip Module*, Sep. 3, 1999, IEEE Transactions on Industry Applications, vol. 36. No. 1. Jan./Feb. 2000, pp. 217-221.

John Gooding, *Microchannel heat exchangers—a review*, SPIE vol. 1997 High Heat Flux Engineering II (1993), pp. 66-82.

Koichiro Kawano et al., *Micro Channel Heat Exhanger for Cooling Electrical Equipment*, HTD-vol. 361-3/PID-vol. 3, Proceeding of the ASME Heat Transfer Division—vol. 3, ASME 1998, pp. 173-188.

Chan Harris et al., *Design and Fabrication of a Cross Flow Micro Heat Exchanger*, Dec. 2000, Journal of Microelectromechanical Systems, vol. 9, No. 4, pp. 502-508.

George M. Harpole et al., *Micro-Channel Heat Exchanger Optimization*, 1991, Seventh IEEE SEMI-THERM Symposium, pp. 59-63.

Pei-Xue Jiang et al., *Thermal-hydraulic performance of small scale micro-channel and prous-media heat-exchangers*, 2001, International Journal of Heat and Mass Transfer 44 (2001), pp. 1039-1051.

X.N. Jiang et al., *Laminar Flow Through Microchannels Used for Microscale Cooling Systems*, 1997, IEEE/CPMT Electronic Packaging Technology Conference, pp. 119-122, Singapore.

David Bazeley Tuckerman, *Heat-Transfer Microstructures for Integrated Circuits*, Feb. 1984, pp. ii-xix, pp. 1-141.

M. Esashi, *Silicon micromachining for integrated microsystems*, 1996, Vacuum/vol. 47/Nos. 6-8/pp. 469-474.

T.S. Raviguruajan et al., *Effects of Heat Flux on Two-Phase Flow characteristics of Refrigerant Flows in a Micro-Channel Heat Exchanger*, HTD-vol. 329, National Heat Transfer Conference, vol. 7, ASME 1996, pp. 167-178.

T.S. Ravigruruajan et al., *Single-Phase Flow Thermal Performance Characteristics of a Parallel Micro-Channel Heat Exchanger*, 1996, HTD-vol. 329, National Heat Transfer Conference, vol. 7, ASME 1996, pp. 157-166.

T.S. Ravigururajan et al., *Liquid Flow Characteristics in a Diamond-Pattern Micro-Heat-Exchanger*, DSC-vol. 59 Microelectromechanical Systems (IMEMS), ASME 1996, pp. 159-166.

T.S. Raviguruajan, *Impact of Channel Geometry on Two-Phase Flow Heat Transfer Characterisitics of Refrigerants in Microchannel Heat Exchangers*, May 1998, Journal of Heat Transfer, vol. 120, pp. 485-491.

J. Pfahler et al., *Liquid Transport in Micron and Submicron Channels*, Mar. 1990, Sensors and Actuators, A21-A23 (1990), pp. 431-434.

Kenneth Pettigrew et al., *Performance of a MEMS based Micro Capillary Pumped Loop for Chip-Level Temperature Control*, 2001, The 14th IEEE International Conference on Micro Electro Mechanical Systems, pp. 427-430.

C. Perret et al., *Microchannel integrated heat sinks in silicon technology*, Oct. 12-15, 1998, The 1998 IEEE Industry Applications Conference, pp. 1051-1055.

X.F. Peng et al., *Convective heat transfer and flow friction for water flow in microchannel structures*, 1996, Int. J. Heat Mass Transfer, vol. 39, No. 12, pp. 2599-2608, printed in Great Britain.

X.F. Peng et al., *Experimental investigation of heat transfer in flat plates with rectangular microchannels*, 1994, Int. J. Heat Mass Transfer, vol. 38, No. 1, pp. 127-137, printed in Great Britain.

X.F. Peng et al., *Cooling Characteristics with Microchanneled Structures*, 1994, Enhanced Heat Transfer, vol. 1, No. 4, pp. 315-326, printed in the United States of America.

X.F. Peng et al., *Enhancing the Critical Heat Flux Using Microchanneled Surfaces*, 1998, Enhanced Heat Transfer, vol. 5, pp. 165-176, Printed in India.

Yoichi Murakami et al., *Parametric Optimization of Multichananneled Heat Sinks for VLSI Chip Cooling*, Mar. 2002, IEEE Transaction on Components and Packaging Technologies, vol. 24, No. 1, pp. 2-9.

M.J. Marongiu et al., *Enhancement of Multichip Modules (MCMs) Cooling by Incorporating MicroHeatPipes and Other High Thermal Conductivity Materials into Microchannel Heat Sinks*, 1998, Electronic Components and Technology Conference, pp. 45-50.

C.R. Friedrich et al., *Micro heat exchangers fabricated by diamond machining*, Jan. 1994, Precision Engineering, vol. 16, No. 1, pp. 56-59.

Mali Mahalingam, *Thermal Management in Semiconductor Device Packaging*, 1985, Proceedings of the IEEE, vol. 73, No. 9, Sep. 1985, pp. 1396-1404.

T.M. Adams et al., *An experimental investigation of single-phase forced convection in microchannels*, 1997, Int. J. Heat Mass Transfer, vol. 41, Nos. 6-7, pp. 851-857, Printed in Great Britain.

Bassam Badran et al., *Experimental Results for Low-Temperature Silicon Micromachined Micro Heat Pipe Arrays Using Water and Methanol as Working Fluids*, May 31, 1997, Experimental Heat Transfer, 10: pp. 253-272.

D. Jed Harrison et al., *Electroosmotic Pumping Within A Chemical Sensor System Integrated on Silicon*, Session C9 Chemical Sensors and Systems for Liquids, Jun. 26, 1991, pp. 792-795.

Gh. Mohiuddin Mala et al., *Flow Characteristics of water through a microchannel between two parallel plates with electrokinetic effects*, 1997, Int. J. Heat and Fluid Flow, vol. 18, No. 5, pp. 489-496.

Stephanus Buttgenbach et al., *Microflow devices for miniaturized chemical analysis systems*, Nov. 4-5, 1998, SPIE-Chemical Microsensors and Applications, vol. 3539, pp. 51-61.

Sarah Arunlanandam et al., *Liquid transport in rectangular microchannels by electroosmotic pumping*, 2000, Colloids and Surfaces A: Physicochemical and Engineering Aspects vol. 161 (2000), pp. 89-102.

Susan L. R. Barker et al., *Fabrication, Derivatization and Applications of Plastic Microfluidic Devices*, Proceedings of SPIE, vol. 4205. Nov. 5-8, 2000, pp. 112-118.

Timothy E. McKnight et al., *Electroosmotically Induced Hydraulic Pumping with Integrated Electrodes on Microfluidic Devices*, 2001, Anal. Chem., vol. 73, pp. 4045-4049.

Chris Bourne, *Cool Chips plc Receives Nanotech Manufacturing Patent*, Jul. 31, 2002, pp. 1-2.

A. Manz et al., *Integrated Electoosmotic Pumps and Flow Manifolds for Total Chemical Analysis System*, 1991, Inter. Conf. on Solid-State Sensors and Actuators, pp. 939-941.

Ray Beach et al., *Modular Microchannel Cooled Heatsinks for High Average Power Laser Diode Arrays*, Apr. 1992, IEEE JOurnal of Quantum Electronics, vol. 28, No. 4, pp. 966-976.

Roy W. Knight et al., *Optimal Thermal Design of Air cooled Forced Convection finned Heat Sinks—Experimental Verification*, Oct.

1992, IEEE Transactions on Components, Hybrids, and Manufacturing Technology, vol. 15, No. 5 pp. 754-760.

Xiaoqing Yin et al., *Micro Heat Exchangers Consisting of Pin Arrays*, 1997, Journal of Electronic Packaging Mar. 1997, vol. 119, pp. 51-57.

X. Yin et al., *Uniform Channel Micro Heat Exchangers*, 1997, Journal of Electronic Packaging Jun. 1997, vol. 119, No. 2, pp. 89-94.

Chun Yang et al., *Modeling forced liquid convection in rectangular microchannels with electrokinetic effect*, 1998, International Journal of Heat and Mass Transfer 41 (1998), pp. 4229-4249.

Arel Weisberg et al., *Analysis of microchannels for integrated cooling*, 1992, Int. J. Heat Mass Transfer, vol. 35, No. 10, pp. 2465-2473.

Roger S. Stanley et al., *Two-Phase Flow in Microchannels*, 1997, DSE-vol. 62/HTD-vol. 354, MEMS, pp. 143-152.

B. X. Wang et al., *Experimental investigation on liquid forced-convection heat transfer through microchannels*, 1994, Int. J. Heat Mass Transfer, vol. 37 Suppl. 1, pp. 73-82.

Kambiz Vafai et al., *Analysis of two-layered micro-channel heat sink concept in electronic cooling*, 1999, Int. J. Heat Mass Transfer, 42 (1999), pp. 2287-2297.

Gokturk Tune et al., *Heat transfer in rectangular microchannels*, 2002, Int. J. Heat Mass Transfer, 45 (2002), pp. 765-773.

D. B. Tuckerman et al., *High-Performance Heat Sinking for VLSI*, 1981, IEEE Electron Device Letters, vol. EDL-2, No. 5, pp. 126-129.

Bengt Sunden et al., *An Overview of Fabrication Methods and Fluid Flow and Heat Transfer Characteristics of Micro Channels*, pp. 3-23.

David S. Shen et al., *Micro Heat Spreader Enhance Heat Transfer in MCMs*, 1995, IEEE Multi-Chip Module Conference, pp. 189-194.

S. Sasaki et al., *Optimal Structure for Microgrooved Cooling Fin for High-Power LSI Devices*, Electronic Letters, Dec. 4, 1986, vol. 22, No. 25.

Vijay K. Samalam, *Convective Heat Transfer in Microchannels*, Sep. 1989, Journal of Electronic Materials, vol. 18, No. 5, pp. 611-617.

Sanjay K. Roy et al., *A Very High Heat Flux Microchannel Heat Exchanger for Cooling of Semiconductor Laser Diode Arrays*, 1996, IEEE Transactions on components, packaging, and manufacturing technology-part B, vol. 19, No. 2, pp. 444-451.

Charlotte Gillot et al., *Integrated Single and Two-Phase Micro Heat Sinks Under IGBT Chips*, IEEE Transactions on Components and Packaging Technology, vol. 22 No. 3, Sep. 1999, pp. 384-389.

H. Krumm "Chip Cooling", IBM Technical Disclosure Bulletin, vol. 20, No. 7, Dec. 1977, p. 2728.

Jae-Mo Koo et al., "Modeling of Two-Phase Microchannel Heat Sinks for VLSI Chips", Mech. Eng. Depart. of Stanford University, pp. 422-426.

* cited by examiner

MULTI-LEVEL MICROCHANNEL HEAT EXCHANGERS

RELATED APPLICATION

This application claims priority under 35 U.S.C. § 119(e) of the co-pending U.S. provisional patent application Ser. No. 60/455,729, filed on Mar. 17, 2003, and titled "Microchannel Heat Exchanger Apparatus with Porous Configuration and Method of Manufacturing Thereof." The provisional patent application Ser. No. 60/455,729, filed on Mar. 17, 2003, and titled "Microchannel Heat Exchanger Apparatus with Porous Configuration and Method of Manufacturing Thereof" is hereby incorporated by reference.

FIELD OF THE INVENTION

This invention relates to the field of heat exchangers. More specifically, this invention relates to micro-channel structures used in a heat exchanger for carrying heat-absorbing fluids.

BACKGROUND OF THE INVENTION

Heat sinks are an important component in many devices, particularly in semiconductor devices, where smaller device-geometries in more powerful circuits generate more heat in a smaller area. Overheated components often fail and must be replaced, an expensive and time-consuming process.

Many heat sinks contain channels that span the entire length of a heat-generating device. These heat sinks suffer from several drawbacks. For example, these heat sinks do not allow heat-absorbing materials to be concentrated in a specific area. These heat sinks also suffer from pressure drops along the length of the channels, preventing a uniform flow of a cooling material along the channel. Also, because the channels span a relatively long distance, after they absorb heat along a first section of the channel, they are less able to absorb heat along later sections of the channel. The heat-absorbing ability of the cooling material circulating along the channel is thus diminished, and the heat-generating device is not sufficiently cooled.

Accordingly, there is a need for a structure and method of circulating a cooling material within a heat exchanger to overcome these and other disadvantages when cooling a heat-generating device.

BRIEF SUMMARY OF THE INVENTION

A heat exchanger provides vertically stacked multichannels, which together effectively draw heat away from a heat-generating device. The vertically stacked multichannels allow substantially uniform pressure flows within the channels and allow the flow of cooling materials to be accurately concentrated over specific areas.

In a first aspect of the present invention, a heat exchanger comprises a manifold layer and an interface layer. The manifold layer has a first plurality of openings for providing a cooling material to the heat exchanger and a second plurality of openings for removing the cooling material (e.g., liquid or vapor) from the heat exchanger. The interface layer is coupled to the manifold layer and has a plurality of routes that each extends from one of the first plurality of openings and terminates at a corresponding one of the second plurality of openings. The routes are used to carry the cooling material. The plurality of routes are substantially contained in a plane non-parallel, preferably substantially perpendicular, to a heat-exchanging plane. Preferably, each route is adjacent to another route, whereby heat can be exchanged between cooling material circulating within adjacent routes.

In one embodiment, each route extends from one of the first plurality of openings toward the heat-exchanging plane and then turns to extend away from the heat-exchanging plane toward a corresponding one of the second plurality of openings. Preferably, each route is substantially U shaped. In another embodiment, after a route extends from one of the first plurality of openings and before the route extends toward one of the second plurality of openings, the route extends substantially parallel to the heat-exchanging plane. In another embodiment, the interface layer comprises a structural material having a thermal conductivity of at least approximately 20 W/m-K. Preferably, the structural material comprises a semiconductor. Alternatively, the structural material comprises a metal, a porous material that defines the plurality of routes, such as a porous metal or a silicon foam, or a composite of materials. The cooling material typically comprises a liquid but could also comprise one or more gases (e.g. air), vapor, or a combination of one or more liquids, gases, and vapors. Preferably, the liquid comprises water. In another embodiment, the first plurality of openings and the second plurality of openings lie substantially in a single plane.

In another embodiment, the heat exchanger further comprises a heat insulator between the first plurality of openings and the second plurality of openings. Preferably, the heat insulator comprises an air gap. Alternatively, the heat insulator can comprise a vacuum gap or any thermally-insulating material having a thermal conductivity of approximately 5 W/m-K or less. In another embodiment, a cross-sectional dimension of a route, such as an area, changes as it extends from one of the first plurality of openings to a corresponding one of the second plurality of openings. Preferably, a cross-sectional dimension of a route increases uniformly as it extends from one of the first plurality of openings to one of a second plurality of openings.

In another embodiment, the heat exchanger further comprises a heat-generating device coupled to a bottom surface of the interface layer. In another embodiment, the heat-generating device is formed integrally with the bottom surface of the interface layer. Preferably, the heat-generating device is a semiconductor device. In another embodiment, each route comprises a channel. In another embodiment, the plurality of routes is defined by a plurality of pin fins. Preferably, the plurality of pin fins are positioned crosswise to the plurality of routes. In another embodiment, the heat exchanger further comprises a pump coupled to the first plurality of openings. In another embodiment, the manifold layer and the interface layer form a monolithic device.

In a second aspect of the present invention, a method of forming a heat exchanger comprises forming a manifold layer having a first plurality of openings for providing a cooling material to the heat exchanger and a second plurality of openings for removing the cooling material from the heat exchanger, and forming an interface layer coupled to the manifold layer. The interface layer has a plurality of routes that each extends from one of the first plurality of openings and terminates at a corresponding one of the second plurality of openings. Each route is used to carry the cooling material. The plurality of routes are substantially contained in a plane non-parallel, preferably substantially perpendicular, to a heat-exchanging plane. In one embodiment, each route is adjacent to another route. In another embodiment, each route extends from one of the first plurality of openings toward the heat-exchanging plane and then turns to extend away from the heat-exchanging plane toward a corresponding one of the second plurality of openings. Preferably, each route is substantially U shaped. In another embodiment, after a route extends from one of the first plurality of openings and before the route extends toward one of the second plurality of openings, the route extends substantially parallel to the heat-exchanging plane.

In one embodiment, the interface layer comprises a structural material having a thermal conductivity of at least approximately 20 W/m-K. Preferably, the structural material comprises a semiconductor. In another embodiment, the interface layer comprises a structural material that exhibits anisotropic etching. Preferably, the structural material that exhibits anisotropic etching is selected from the group consisting of micro-scale copper tubing and copper filaments. Alternatively, the structural material comprises a metal, a porous material that defines the plurality of routes, such as a porous metal or a silicon foam, or a composite of materials. In another embodiment, the first plurality of openings and the second plurality of openings lie substantially in a single plane.

In another embodiment, the method further comprises forming a heat insulator between the first plurality of openings and the second plurality of openings. Preferably, the heat insulator comprises an air gap. Alternatively, the heat insulator can comprise a vacuum gap or any thermally-insulating material having a thermal conductivity of approximately 5 W/m-K or less. In another embodiment, a cross-sectional dimension of a route changes as it extends from one of the first plurality of openings to a corresponding one of the second plurality of openings. Preferably, a cross-sectional dimension of a route increases uniformly as it extends from one of the first plurality of openings to a corresponding one of a second plurality of openings.

In another embodiment, the method further comprises coupling a heat-generating device to a bottom surface of the interface layer. In another embodiment, the method comprises integrally forming the heat-generating device to the bottom surface of the interface layer. Preferably, the heat-generating device is a semiconductor device. In another embodiment, each route comprises a channel. In another embodiment, each route is defined by a plurality of pin fins. Preferably, the pin fins are positioned crosswise to the plurality of routes. In another embodiment, the manifold layer and the interface layer form a monolithic device. In another embodiment, the step of forming an interface layer comprises patterning a semiconductor device and etching the patterned semiconductor device to form the interface layer. In another embodiment, the step of forming the interface layer comprises stamping a thin sheet of metal. In another embodiment, the step of forming the interface layer comprises molding a material in the form of the interface layer, such as molding a metal using metal injection molding (MIM) or plastic injection molding to form the interface layer.

In a third aspect of the present invention, a method of cooling a device comprises transmitting a cooling material from an inlet manifold, through a plurality of stacked routes positioned over the device, and to an outlet manifold. In one embodiment, the stacked routes comprise a structural material having a thermal conductivity of at least approximately 20 W/m-K. Preferably, the structural material comprises a semiconductor. In other embodiments, the structural material comprises a metal or a porous material such as a porous metal or a silicon foam. In another embodiment, the plurality of stacked routes comprise pin fins. In another embodiment, the cooling material comprises water. Alternatively, the cooling material comprises one or more gases (e.g., air), vapors, or any combination of liquids, gases, and vapors.

DETAILED DESCRIPTION OF THE INVENTION

Figure 1:
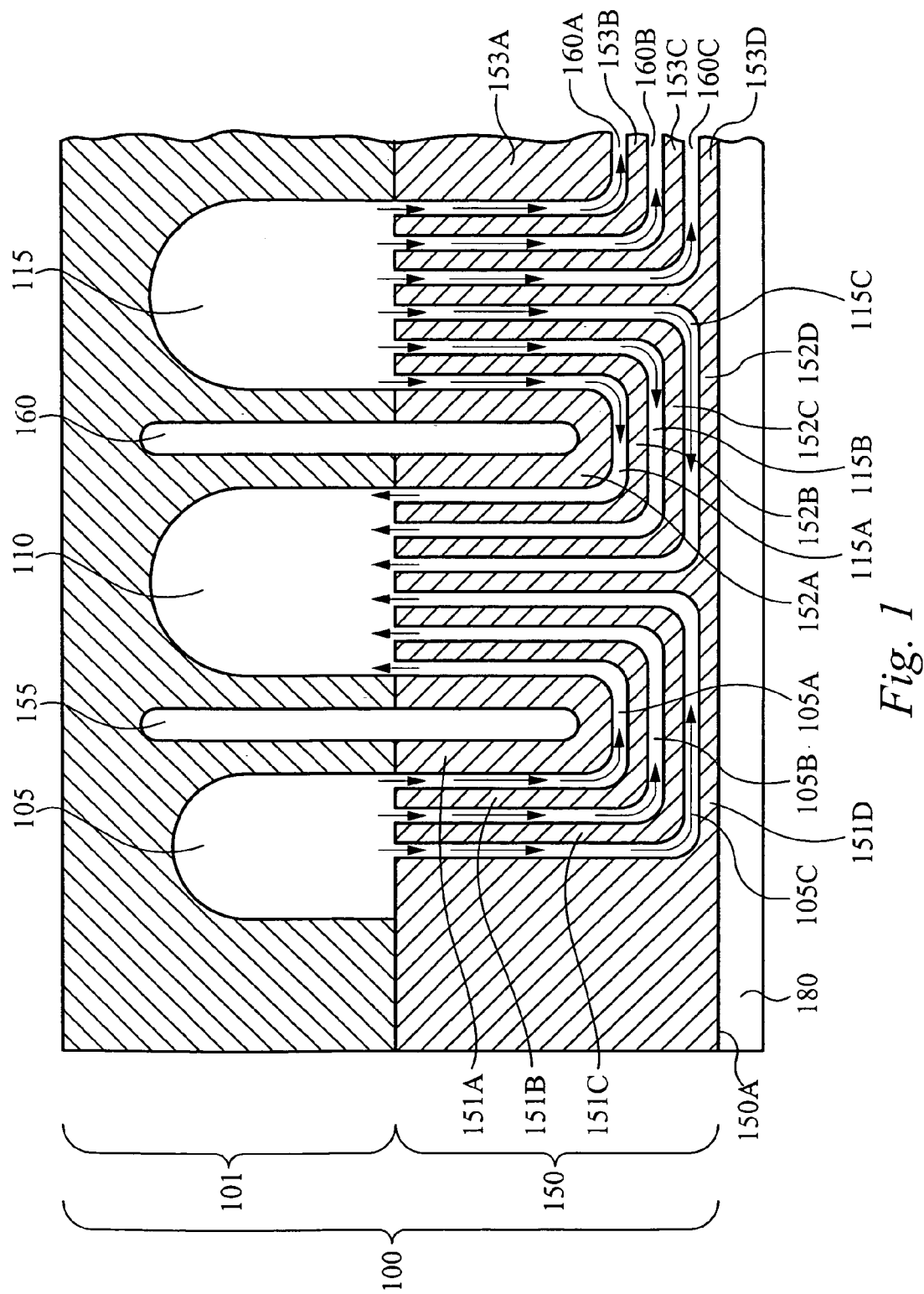
FIG. 1 is a side cross-sectional view of a heat exchanger in accordance with one embodiment of the present invention.

FIG. 1 is a side cross-sectional view of a section of a heat exchanger 100, in accordance with one embodiment of the present invention, coupled to a heat-generating device 180. The heat exchanger 100 comprises a manifold layer 101 coupled to an interface layer 150. In operation, a cooling (i.e., heat-absorbing) material is introduced into a portion of the manifold layer 101, is transmitted through channels in the interface layer, where it absorbs heat generated by the heat-generating device 180, is transmitted to another portion of the manifold layer 101, and is extracted from the heat exchanger 100. By absorbing and carrying away heat generated by the heat-generating device 180, the cooling material cools the heat-generating device 180. As used herein, the surface at which the heat exchanger couples to a beat-generating device is referred to as a heat-exchanging plane.

It will be appreciated that the heat-exchanging plane can be planar or substantially planar, or it can have other shapes.

The manifold layer 101 comprises a plurality of openings 105, 110, and 115 and heat insulators 155 and 160, described in more detail below. It will be appreciated that the heat insulators 155 and 160 are not required to practice the present invention. The interface layer 150 comprises a plurality of channels 105A, 105B, 105C, 115A, 115B, 115C, 160A, 160B, and 160C, as well as the heat insulators 155 and 160. The insulators 155 and 160 thus extend from and form part of both the manifold layer 101 and the interface layer 150. As illustrated in FIG. 1, the channel 105A is adjacent to the channel 105B, which is adjacent to the channel 105C; the channel 115A is adjacent to the channel 115B, which is adjacent to the channel 115C; and the channel 160A is adjacent to the channel 160B, which is adjacent to the channel 160C.

Other structures for manifold layers are taught, for example, in co-pending U.S. patent application Ser. No. 10/439,635, filed on May 16, 2003, and titled "Method and Apparatus for Flexible Fluid Delivery for Cooling Desired Hot Spots in a Heat Producing Device," which is hereby incorporated by reference.

As illustrated in FIG. 1, the channels 105A, 105B, and 105C each has one end coupled to the opening 105 and another end coupled to the opening 110. Each of the channels 105A–C extends from the opening 105, toward a bottom (e.g., heat-exchanging) plane 150A of the interface layer 150, turns, extends substantially parallel to the bottom plane 150A (thus defining an "elongated U shape"), turns away from the bottom plane 150A, and then extends to the opening 110, terminating at the opening 110. Thus, each of the channels 105A–C has an elongated elbow or U-shape.

The channels 115A, 115B, and 115C each has one end coupled to the opening 115 and another end coupled to the opening 110. Each of the channels 115A–C extends from the opening 110, toward the bottom plane 150A, turns, extends substantially parallel to the bottom plane 150A, turns away from the bottom plane 150A, and then extends to the opening 110, terminating at the opening 110. Thus, each of the channels 115A–C has an elongated elbow or U-shape.

Finally, the channels 160A, 160B, and 160C each has one end coupled to the opening 115 and another end (not shown) coupled to an opening (not shown). In that section of the heat exchanger 100 illustrated in FIG. 1, the channels 160A, 160B, and 160C each extends from the opening 115, toward the bottom plane 150A, and turns. It will be appreciated that the sections of the channels 160A, 160B, and 160C not shown extends substantially parallel to the bottom plane 150A, turns away from the bottom plane 150A, and extends toward and terminates at an opening (not shown) similar to the other complete microchannels illustrated in this drawing.

Figure 2:
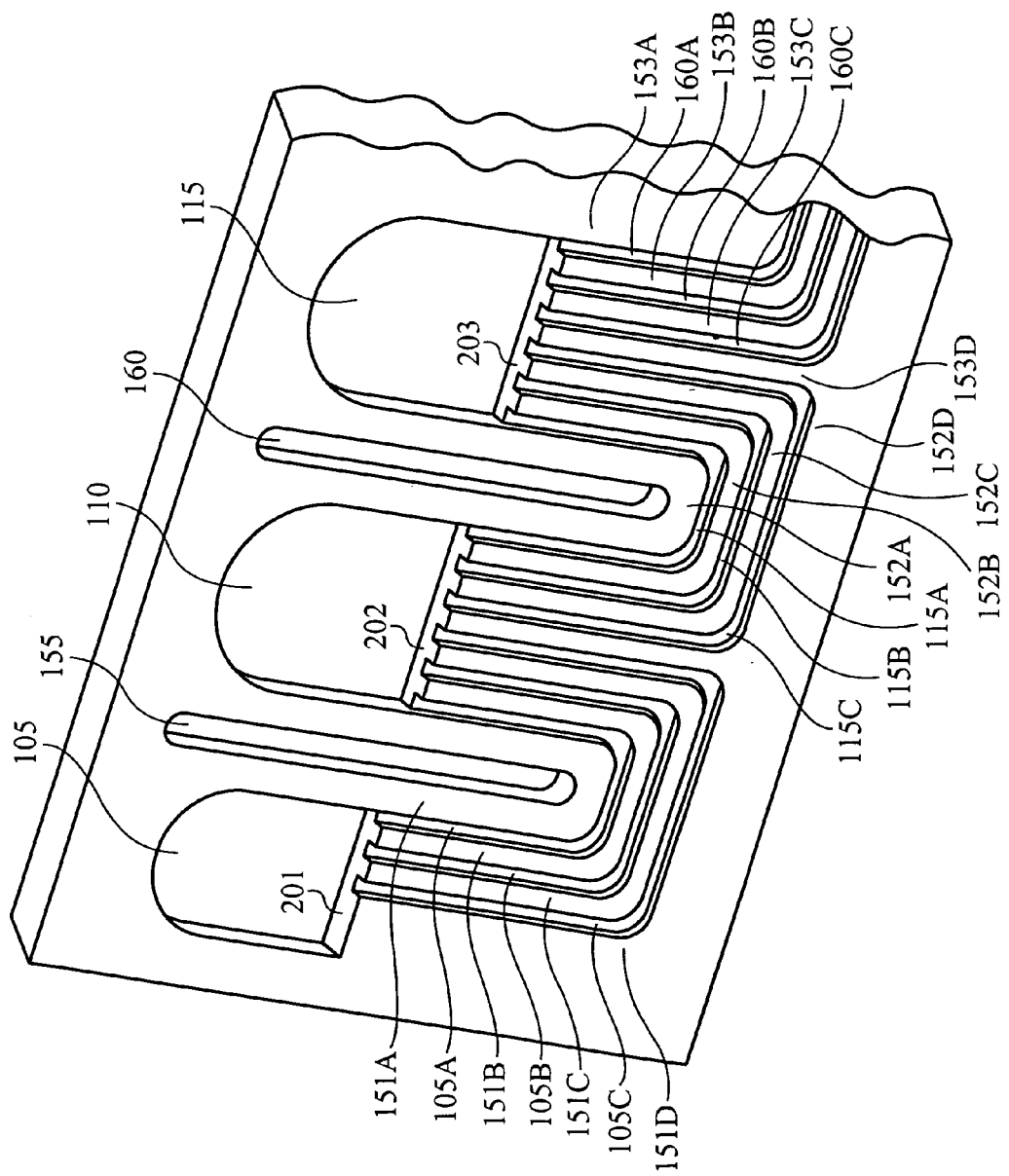
FIG. 2 is a perspective view of section of a slice of the heat exchanger of FIG. 1.

As described in more detail below and, for example, illustrated in FIG. 2, the channels 105A–C, 115A–C, and 160A–C, are each defined by single-sided ridged fins. FIG. 2 depicts a heat-sink slice, as shown in the cross-sectional view of FIG. 1. As described in more detail below, heat-sink slices can be used alone or in combination with other heat-sink slices to form larger heat exchangers. As used herein, a single-sided ridged fin refers to a spine and a fin extending from one and only one side of the spine, thus defining a channel. Still referring to FIG. 2, the channel 105A is defined by the ridged fins 151A and 151B, each extending from one side of the spines 201 and 202; the channel 105B is defined by the ridged fins 151B and 151C, each extending from one side of the spines 201 and 202; and the channel 105C is defined by the ridged fins 151C and 151D, each extending from one side of the spines 201 and 202.

Similarly, the channel 115A is defined by the ridged fins 152A and 152B, each extending from one side of the spines 202 and 203; the channel 115B is defined by the ridged fins 152B and 152C, each extending from the side of the spines 202 and 203; and the channel 115C is defined by the ridged fins 152C and 152D, each extending from the side of the spines 202 and 203. The channel 160A is defined by the ridged fins 153A and 153B, each extending from one side of the spine 203; the channel 160B is defined by the ridged fins 153B and 153C, each extending from the side of the spine 203; and the channel 160C is defined by the ridged fins 153C and 153D, each extending from the side of the spine 203.

As illustrated in FIG. 1, a cross section of the channels 105A–C all lie in a single plane, substantially perpendicular to the bottom plane 150A, one located above another, and are thus described as vertically stacked. Similarly, the channels 115A–C are vertically stacked, as are the channels 160A–C. It will be appreciated that in accordance with the present invention, the channels 105A–C, 115A–C, and 160A–C can lie in planes with other orientations to the bottom plane 150, such as planes that are skewed or otherwise non-parallel to the bottom plane 150A. As also illustrated in FIG. 1, the openings 110 and 115 also lie substantially in a single plane parallel to the bottom plane 150A. Such a structure is not necessary to practice the invention but can be used to simplify the fabrication of a heat-sink slice.

Referring to FIG. 1, the interface layer 150, and thus the fins 151A–D, 152A–D, and 153A–D, comprises a heat-conducting material including, but not limited to, a semiconductor, a metal, a plastic, or a combination thereof. As described in more detail below, the interface layer 150 preferably comprises a semiconductor material, which can be easily fabricated using semiconductor-fabrication techniques. Alternatively, the interface layer 150 comprises a metal, a porous material that defines the vertically stacked channels such as a porous metal or a silicon foam, any structural material from which channels can be formed and used to transmit a cooling material, or a composite of materials.

In operation, a heat-generating device 180 is coupled to the interface layer 150, as illustrated in FIG. 1. The heat-generating device 180 can be a semiconductor device, such as a digital processor or an analog device; a power source, such as a battery; a motor; the wall of a heat-generating processing chamber; or any other device or combination of devices that generate heat. Alternatively, the interface layer is integrally formed into a back surface of the heat-generating device, such as a semiconductor device. A cooling material is introduced into the openings 105 and 115. Preferably, the cooling material is water. Alternatively, the cooling material is one or more other liquids, gases, vapors, or a combination of these. Preferably, a pump coupled to the opening 105 pumps the cooling material from the opening 105, through the channels 105A–C, and to the opening 110, as shown by the arrows in FIG. 1. Preferably, a pump coupled to the opening 115 pumps cooling material from the opening 115, through the channels 115A–C, and to the opening 110, also shown by the arrows in FIG. 1. The pump coupled to the opening 115 pumps the cooling material from the opening 115, through the channels 160A–C, and to another opening (not shown). The openings 105 and 115 are thus referred to an inlet manifolds and the opening 110 is referred to as an outlet manifold.

Still referring to FIG. 1, in operation, heat generated by the heat-generating device 180 is conducted from the heat-generating device 180, through the fin 151D, and to the cooling material traveling in the channel 105C. The cooling material, traveling away from the heat-generating device 180, carries the heat away from the heat-generating device 180, to the opening 110. A portion of the heat absorbed by the cooling material circulating in the channel 105C is also conducted through the fin 151C to the cooling material circulating in the channel 105B. In a similar manner, the cooling material circulating in the channel 105B carries the heat away from the channel 105C, to the opening 110. A portion of the heat absorbed by the cooling material is also conducted through the fin 105B to the cooling material circulating in the channel 105A. The cooling material circulating in the channel 105A carries the heat to the opening 110. The heated cooling material collected in the opening 110 can, for example, be removed by a pump, cooled, and re-introduced into the opening 105. Alternatively, the cooling material can be removed from the heat exchanger 100 and replaced by other cooling material that is unheated.

It will be appreciated that cooling material circulating within the channels 115A–C and 160A–C absorb heat from the heat-generating device 180 in a similar manner. Thus, in the discussions that follow, explanations about the channels 105A–C also apply to the channels 115A–C and 160A–C.

The cooling material in the channels 105A–C are hotter at the end coupled to the opening 110 (the discharge end) than at the end coupled to the opening 105 (the introducing end). The heat insulator 155 is used to insulate the introducing end from the discharge end, ensuring that the cooling material at the discharge end does not pre-heat the cooling material in the introducing end of a channel, thus limiting the amount and rate of the heat absorption by the cooling material. Preferably, the insulators 155 and 160 are air gaps. Alternatively, the insulators 155 and 160 are vacuum gaps, an insulating material, or any structure that insulates the introducing end of a channel, such as the channel 105A, from the discharge end of the channel, so that the cooling material is not pre-heated. Preferably, insulating materials and structures used in accordance with the present invention have a thermal conductivity of approximately 5 W/m-K or less.

It is believed that stacking channels as illustrated by, for example, the channels 105A–C in FIG. 1, provides several advantages. For example, a stacked structure allows an inlet manifold to be positioned relatively closely to an outlet manifold. Locating the inlet manifold 105 close to the outlet manifold 110 reduces the length of the channels 105A–C, thus reducing the distance a cooling material must travel when removing heat from the heat-generating device 180. In this way, there is less of a pressure drop across the channel, advantageously resulting in a more uniform flow of the cooling material across the channel. Also, because the cooling material travels a shorter distance, heat is removed more efficiently from the heat-generating device 180. Smaller distances between the inlet manifold and the outlet manifold also allows cooling material to be circulated over a smaller area, allowing greater, more precise control over what areas are to be cooled.

In addition, the uniform elongated U-shape depicted in FIG. 1 allows cooling material to flow more evenly through the channels 105A–C, advantageously providing a uniform pressure distribution through the channels 105A–C. Stacked, multichannel structures, such as that depicted in FIG. 1, are useful because they allow more fluid to move through a device, with less pressure drop, gathering heat effectively because of the high surface-to-volume ratio. In this way, structures in accordance with the present invention function much as a porous metal or silicon foam. It is believed that the uniform, elongated U-shape better achieves the optimal flow length and pressure drops within a channel than do structures with sharp bends.

Heat exchangers in accordance with the present invention can have any number of channels having any combinations of cross-sectional dimensions. In one embodiment, the cross-sectional dimensions of the channels are chosen small enough to maximize the surface-to-volume ratio but large enough to ensure that pressure drops within the channels are small. Also, as discussed below, because channels closest to a heat-exchanging plane absorb more heat than those channels farther from the heat-exchanging plane, channels closer to the heat-exchanging plane can have cross-sectional dimensions larger or smaller than those of channels farther from the heat-exchanging plane, depending on the design preference.

It will be appreciated that the discussions above relating to FIG. 1 are illustrative only. For example, while FIG. 1 illustrates three channels 105A–C extending from the opening 105 to the opening 110, two channels or more than three channels can extend from the opening 105 to the opening 110 in accordance with the present invention. As described in more detail below, shapes other than elongated U-shapes can be used to form the channels 105A–C, 115A–C, and 160A–C. For example, channels having simple U bends (e.g., FIG. 8) rather than elongated U bends can be used. Indeed, the channels can have any shape that allows cooling material to be transmitted from one opening to another in a stacked configuration. Preferably, a shape of a channel allows uniform pressures across the length of the channel. It will also be appreciated that the functioning of the openings 105 and 110, and 115 and 110 can be reversed. For example, a cooling material can be introduced into the opening 110 and transmitted to the openings 105 and 115 using a pump coupled to the opening 110.

Figure 3:
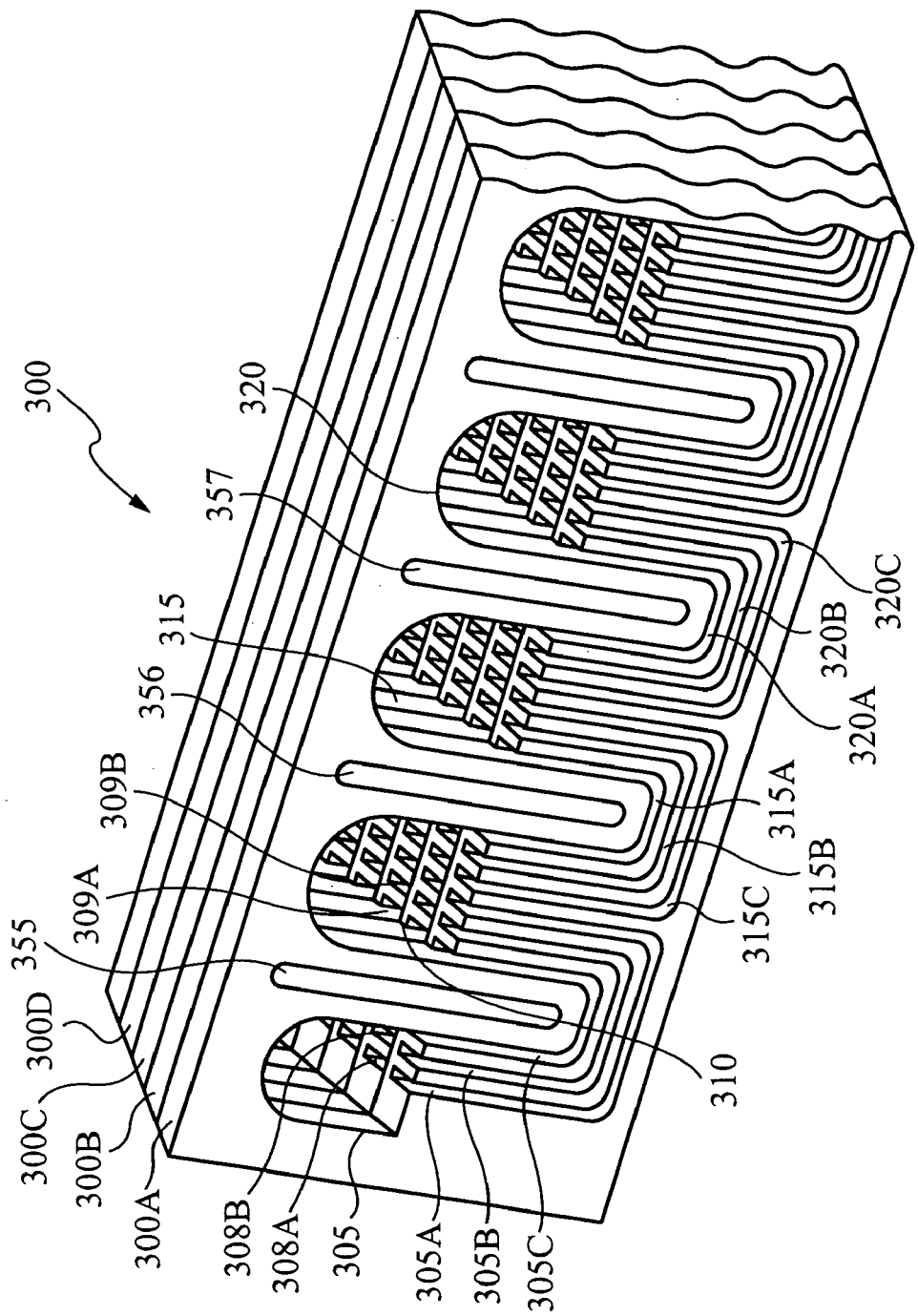
FIG. 3 is a perspective view of a heat exchanger formed by combining a plurality of heat-sink slices similar to that in FIG. 2, in accordance with one embodiment of the present invention.

In accordance with the present invention, a heat-sink slice (e.g., FIG. 2) can be joined to form a heat exchanger that covers and thus draws heat away from a wider area. The heat exchanger 300 illustrated in FIG. 3 is formed by joining a plurality of heat-sink slices such as the heat-sink slice of FIG. 2. A bottom surface of the heat exchanger 300 can contact and thus draw heat from a larger surface area of a heat-generating device than could the heat-sink slice of FIG. 2 alone. The heat exchanger 300 comprises the heat-sink slices 300A–D, each forming part of inlet manifolds 305 and 315, outlet manifolds 310 and 320, and heat insulators 355–357. The heat-sink slice 300A contains a first row of channels comprising the channels 305A–C, 315A–C, and 320A–C. The heat-sink slice 300B contains a second row of channels comprising the channels 308A–B. And the heat-sink slice 300C contains a third row of channels comprising the channels 309A–B. It will be appreciated that only a few of the channels contained in the heat exchanger 300 are described to simplify the illustration of FIG. 3. It will be appreciated that the more rows of channels in the heat exchanger 300, the more cooling material can be used to absorb and carry away heat from a heat-generating device coupled to a heat-exchanging plane of the heat exchanger 300.

The heat exchanger 300 advantageously allows a cooling material to be routed to selected areas of a heat-generating device coupled to the heat exchanger 300. For example, if a heat-generating device only generates heat below the channels 305A–C, then a cooling material need be introduced only into the inlet manifold 305 above the channels 305A–C and removed from the outlet manifold 310. In this way, the amount of both cooling material and energy used to pump the cooling material is minimized. Similarly, as described below in relation to FIG. 4, a cooling material can be introduced into any combination of inlet manifolds and removed from any combination of outlet manifolds, depending on the application at hand. Thus, by controlling pumps coupled to inlet manifolds, a cooling material can be routed along complex three-dimensional paths above the surface of a heat-generating device.

For ease of illustration, FIGS. 1–10 depict heat-sink slices and heat exchangers having symmetrical portions. For example, FIG. 3 illustrates the heat exchanger 300 having similarly shaped outlet manifolds 310 and 320 and similarly shaped channels 305A–C and 320A–C. It will be appreciated that the present invention contemplates symmetrical as well as non-symmetrical portions. For example, the outlet manifolds 310 and 320 can have different shapes, and the channels 305A–C and 320A–C can have different shapes arranged in vertically-stacked channels.

Figure 4:
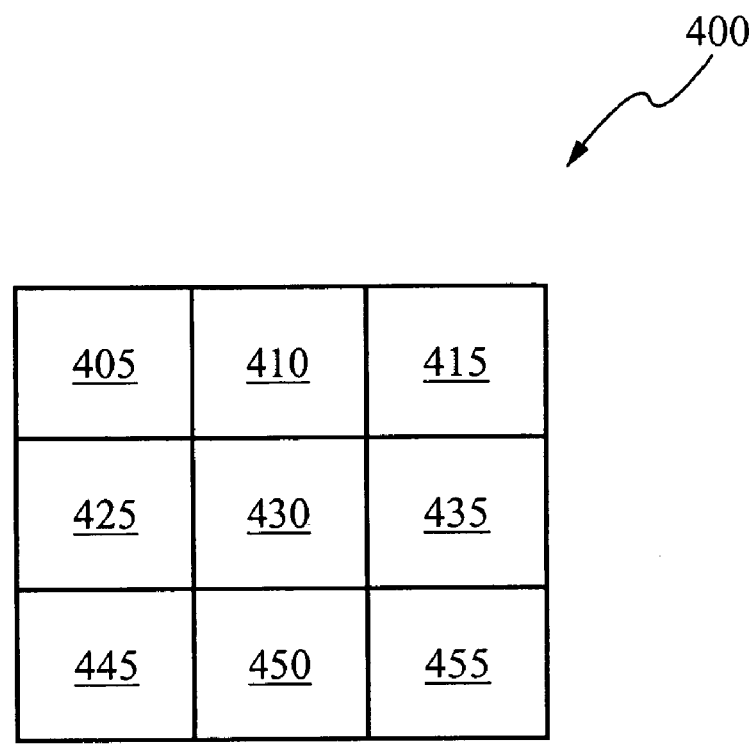
FIG. 4 is a schematic top view of a heat exchanger, in accordance with the present invention, depicting various sections within which a cooling material can be independently circulated.

FIG. 4 is a schematic top view of a heat exchanger 400 comprising inlet manifolds 405 and 445 coupled to an outlet manifold 425, inlet manifolds 410 and 450 coupled to an outlet manifold 430, and inlet manifolds 415 and 455 coupled to an outlet manifold 435. It will be appreciated that the inlet manifolds 405 and 445 and the outlet manifold 425 together comprise one or more heat-sink slices; the inlet manifolds 410 and 450 and the outlet manifold 430 together comprise one or more heat-sink slices; and the inlet manifolds 415 and 455 and the outlet manifold 435 together comprise one or more heat-sink slices. Preferably, a pump is coupled to one or more of the pairs of inlet manifolds 405 and 445, 410 and 450, and 415 and 455 so that a cooling material can be pumped from an inlet manifold to a corresponding outlet manifold. Thus, for example, a pump is coupled to the inlet manifolds 405 and 445 so that a cooling material can be pumped from the inlet manifolds 405 and 445 to the outlet manifold 425, thus cooling a heat-generating device in an area below the inlet manifolds 405 and 445 and the outlet manifold 425. The heat exchanger 400 can be configured so that pumps are only activated so that a cooling material is circulated above those regions that require cooling. Thus, for example, if a heat-generating device coupled to the heat exchanger 400 generates heat in those regions below inlet manifolds 410 and 450 and the outlet manifold 430, then one or more pumps coupled to the inlet manifolds 410 and 450 will be activated so that a cooling material flows from the inlet manifolds 410 and 450 to the outlet manifold 430. No other pumps coupled to the heat exchanger 400 need be activated, thus saving energy.

Figure 5:
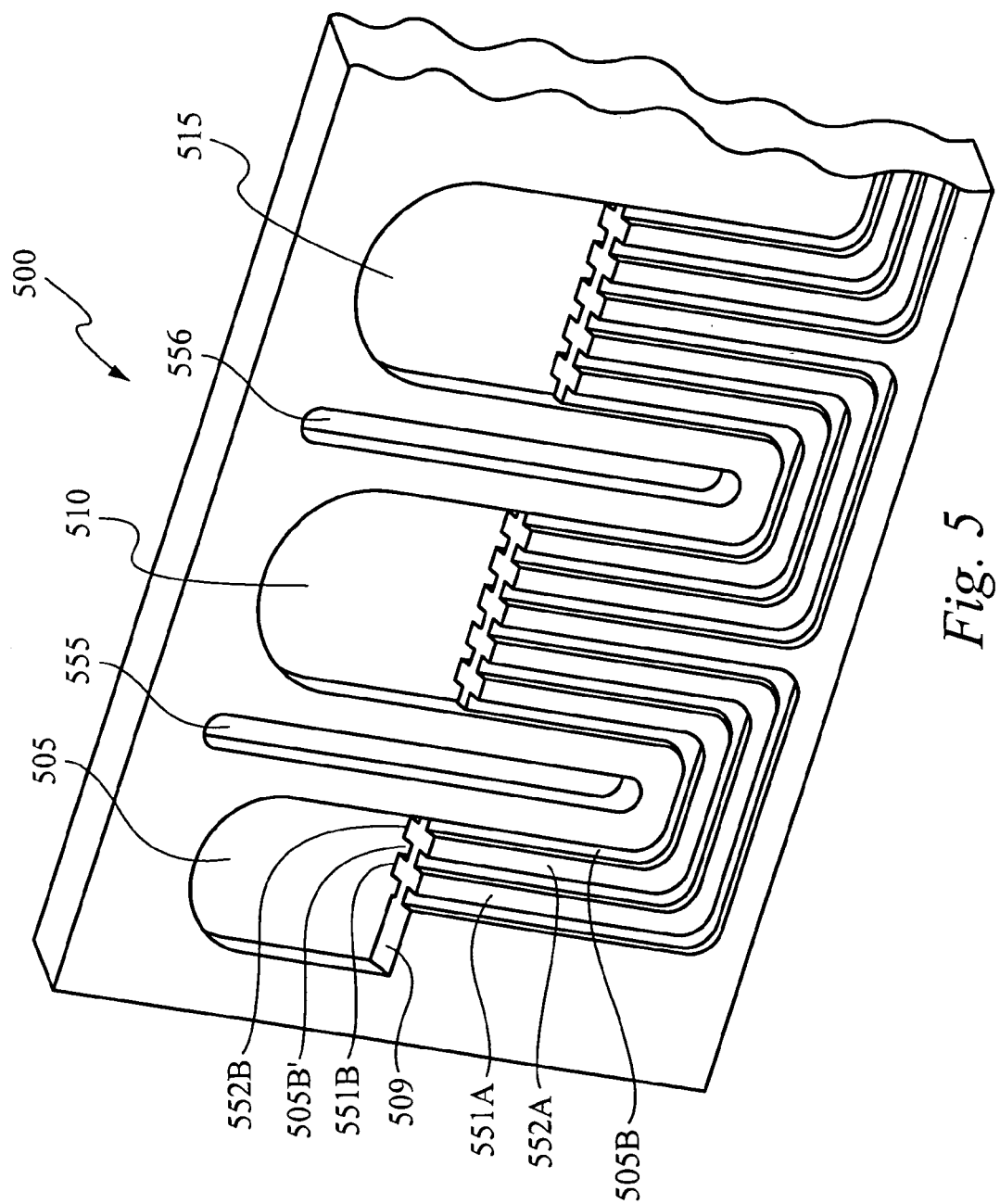
FIG. 5 is a perspective view of a section of a heat-sink slice having double-sided ridged fins, in accordance with one embodiment of the present invention.

It will be appreciated that the components that comprise a heat exchanger can have alternative structures. For example, FIG. 5 illustrates a section of a heat-sink slice 500 that can be used to form a heat exchanger. The heat-sink slice 500 has double-sided ridged fins used to form channels on either side of a spine 509 of the heat-sink slice 500. The heat-sink slice 500 comprises inlet manifolds 505 and 515, an outlet manifold 510, heat insulators 555 and 556, and the spine 509 from which extends double-sided ridged fins 551A and 551B, and 552A and 552B. The double-sided ridged fins 551A and 55 1B, and 552A and 552B are exemplary and define structure found in other double-sided ridged fins in the heat-sink slice 500. The double-sided ridged fins 551A and 552A together form a channel 505B on one side of the spine 509, and the double-sided ridged fins 551B and 552B together form a channel 505B' on another side of the spine 509.

Figure 6:
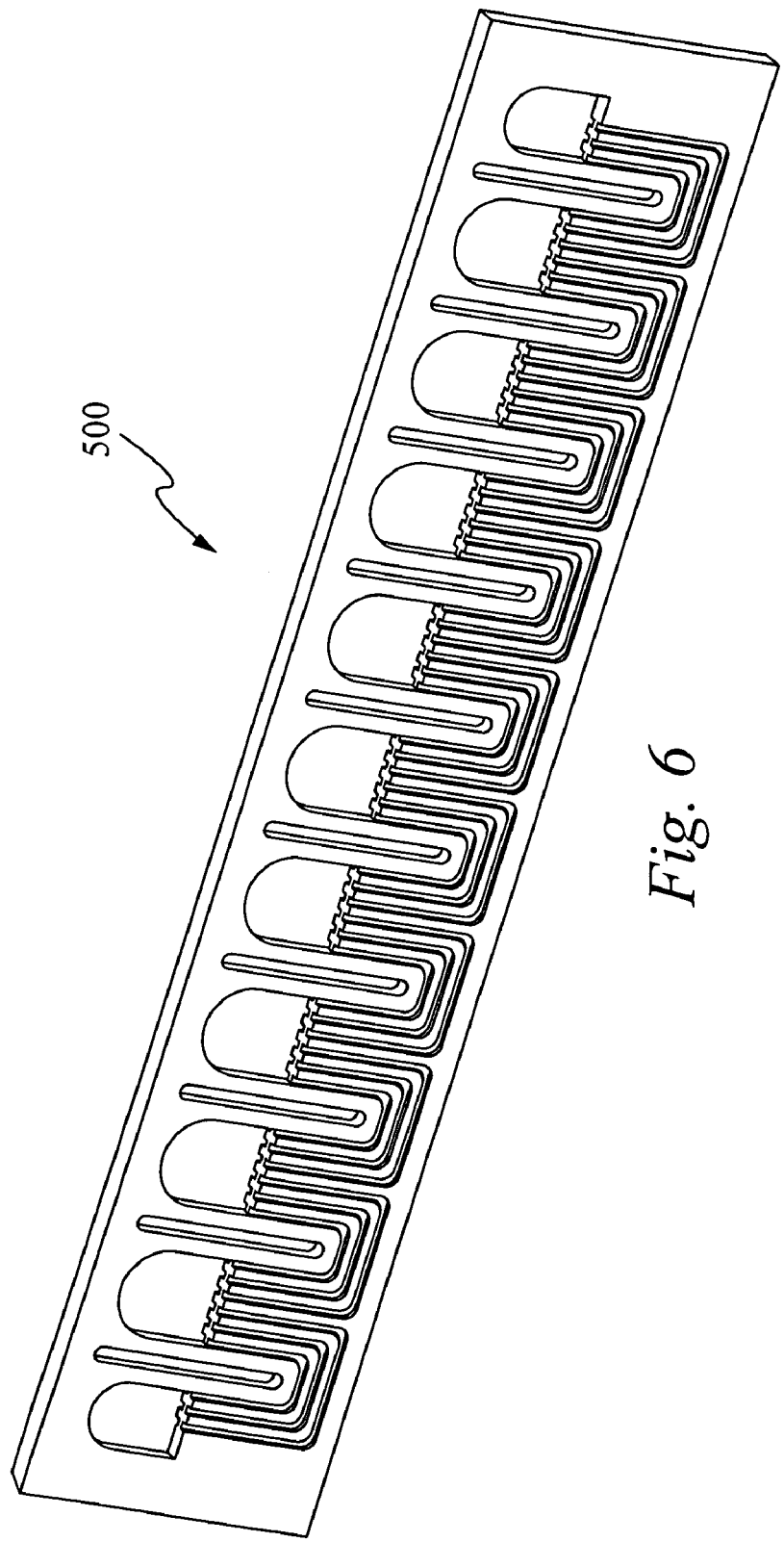
FIG. 6 is a perspective view of a complete section of the heat-sink slice of FIG. 5.
Figure 7:
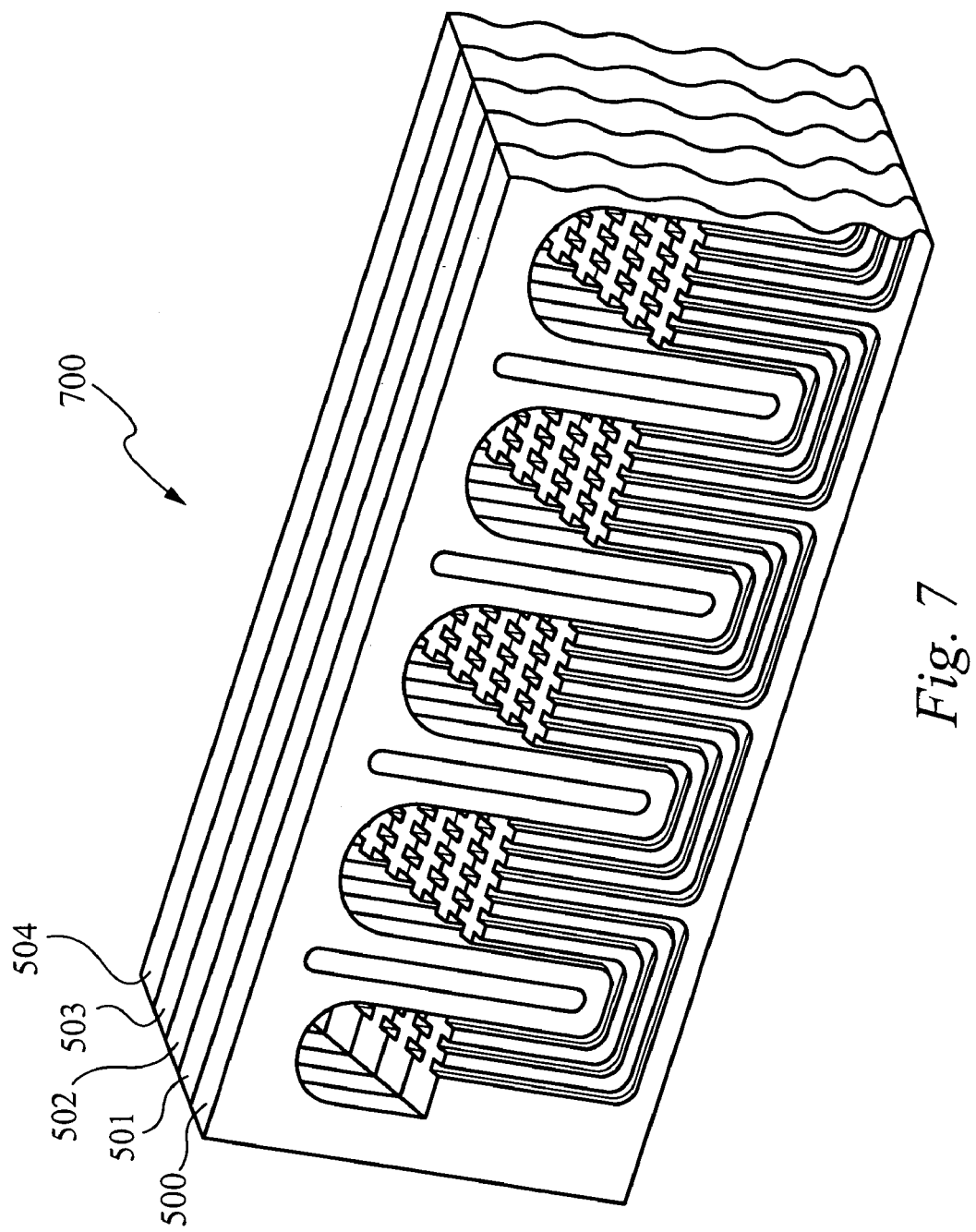
FIG. 7 is a perspective view of a heat exchanger formed by combining a plurality of heat-sink slices having double-edged fins, in accordance with one embodiment of the present invention.

FIG. 6 shows a complete section of the heat-sink slice 500. FIG. 7 shows the heat-sink slice 500 and similar slices 501–504 coupled to form a heat exchanger 700, in accordance with the present invention.

Figure 8:
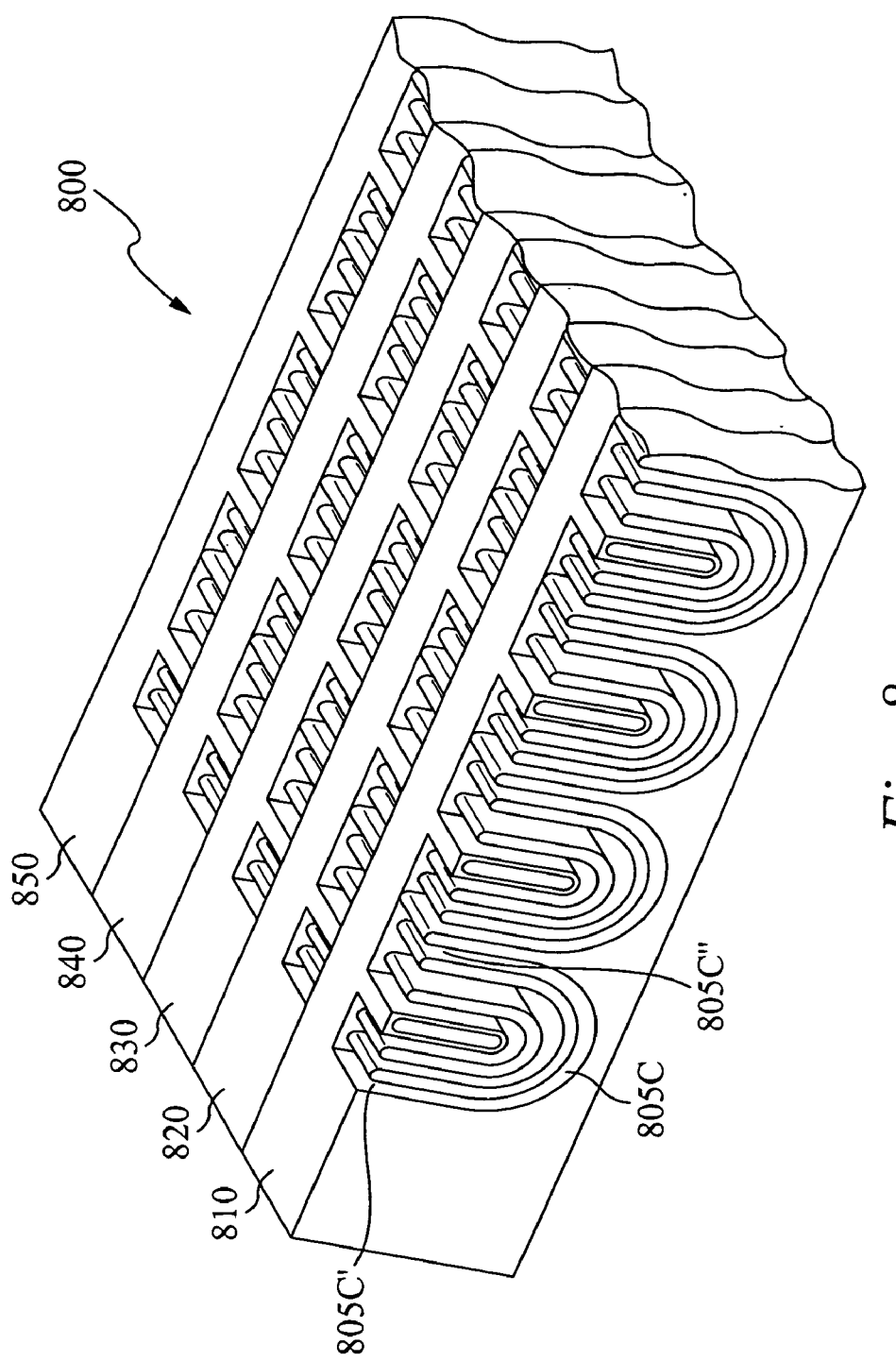
FIG. 8 is a perspective view of a heat exchanger, with the manifold layer removed, and having channels with uniformly increasing cross-sectional areas, in accordance with one embodiment of the present invention.

A heat exchanger 800 shown in FIG. 8 illustrates another embodiment of the present invention. The heat exchanger 800 comprises heat exchanger slices 810, 820, 830, 840, and 850. Each of the heat-sink slices 810, 820, 830, 840, and 850 has channels with a smaller cross-sectional area at an introducing end that at a corresponding discharging end. Thus, for example, a cross-sectional area of the channel 805C at the discharge end (805C") is larger than a cross-sectional area at the introducing end (805C'). Such a structure is useful, for example, for two-phase boiling, in which liquid boils while traveling along a channel. Because the liquid is boiled to produce a gas, the structure allows the larger volume of the gas to be removed from the channel at the same or a greater rate than the liquid is introduced into the channel 805C. This ensures that the liquid is not trapped within the channel 805C, causing heat to be removed from the heat-generating device at a less than optimal rate.

FIG. 8 depicts the cross-sectional area of the channel 805C increasing uniformly as the channel extends from the location 805C' to the location 805C". It will be appreciated that the present invention contemplates channels in which a cross-sectional dimension of a channel changes uniformly, non-uniformly, or in any pre-determined manner as the channel extends from an inlet manifold to an outlet manifold. For example, in accordance with the present invention, the cross-sectional areas of a channel can decrease uniformly or they can vary non-uniformly in any pre-determined manner as the channel extends from an inlet manifold to an outlet manifold.

Figure 9:
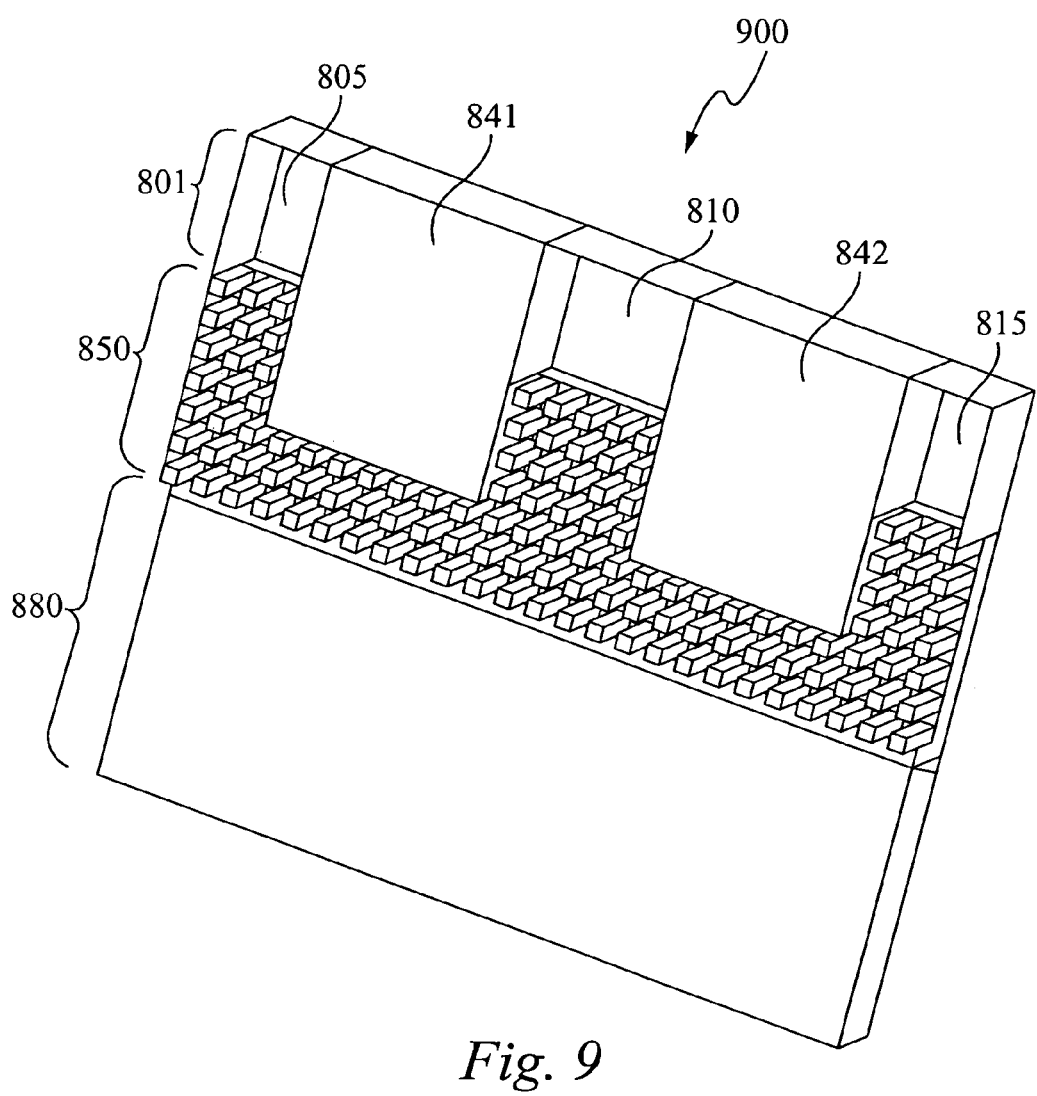
FIG. 9 is a perspective view of a heat exchanger having pin fins, in accordance with one embodiment of the present invention.
Figure 10:
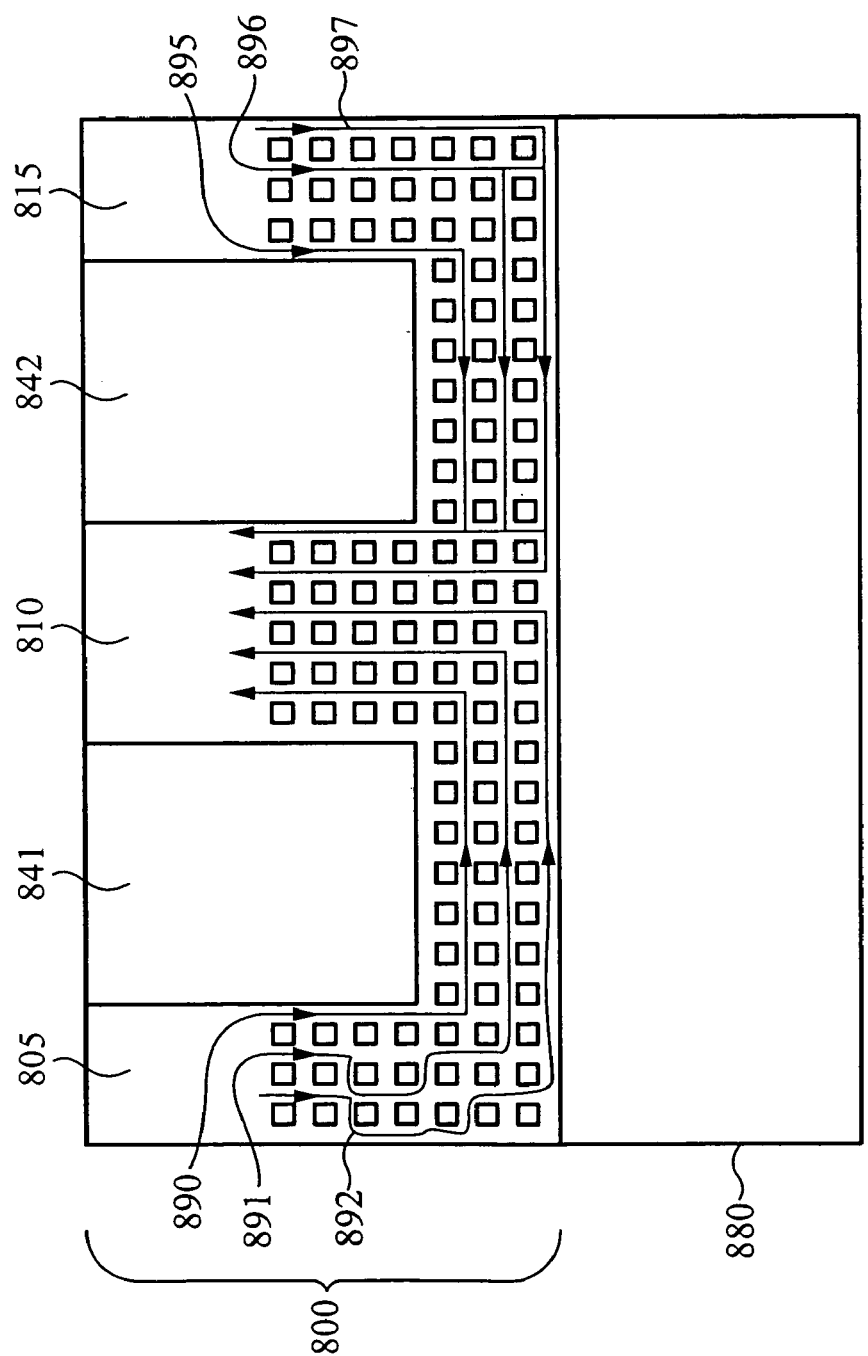
FIG. 10 is a side view of the heat exchanger of FIG. 9, depicting a plurality of fluid flow paths, in accordance with one embodiment of the present invention.

It will be appreciated that a heat-sink in accordance with the present invention can comprise other path-defining structures having a plurality of stacked routes. For example, FIG. 9 is a perspective view of a heat-sink slice 900, in accordance with one embodiment of the present invention, coupled to a heat-generating device 880. The heat-sink slice 900 comprises a manifold layer 801 and an interface layer 850. Preferably, the interface layer comprises a structural material having a thermal conductivity of at least approximately 20 W/m-K. The manifold layer 801 comprises inlet manifolds 805 and 815, an outlet manifold 810, and heat insulators 841 and 842. The interface layer 850 comprises the heat insulators 841 and 842 and an array of high surface area pin fins. The array of high surface-area pin fins defines an array of vertically stacked paths from the inlet manifolds 810 and 815 to the outlet manifold 810. FIG. 10 is a side cross-sectional view of the heat-sink slice 900 coupled to the heat-generating device 880.

FIG. 10 also depicts a plurality of fluid flow paths 890–892 from the inlet manifold 805 to the outlet manifold 810 and a plurality of fluid flow paths 895–897 from the inlet manifold 815 to the outlet manifold 810. FIG. 10 illustrates that the fluid flow paths 890–892 and 895–897 are vertically stacked, in accordance with the present invention. It will be appreciated that heat is radiated upward, between adjacent fluid routes, rather than by conducting fins, as for example in FIG. 1. As illustrated in FIG. 10, the plurality of pin fins extend from a surface of the interface layer 850, crosswise to the direction of the fluid flow paths 890–892 and 895–897. It will be appreciated that in accordance with the present invention, the plurality of pin fins can be oriented in positions other than crosswise to the direction of the fluid flow paths 890–892 and 895–897 as long as the plurality of pin fins direct the fluid along vertically stacked fluid flow paths.

It will be appreciated that a cooling material such as a fluid can travel many paths within the array of pin fins. Thus, the cooling material can travel in vertically stacked paths from the inlet manifold 805 to the outlet manifold 810, for example, using routes other than those depicted in FIG. 10. It will also be appreciated that while FIGS. 9 and 10 depict a symmetrical array of pin fins 850, staggered or non-symmetrical arrays of pin fins can also be used in accordance with the present invention. Pin fins can have many shapes including, but not limited to, square, round, elliptical, orthogonal, other geometric, non-geometric, regular, and irregular shapes.

A heat exchanger in accordance with the present invention can be fabricated in a number of ways. For example, one or more heat-sink slices can be formed from a semiconductor or other material using semiconductor-fabrication techniques. An interface layer of a heat-sink slice can be formed from a semiconductor device that is patterned using photolithography and then etched to form the microchannels. Plasma etching, chemical etching, or other types of etching can be performed. Multiple heat-sink slices can then be fused together and diced (if necessary). Heat-sink slices can be bonded together and a manifold layer bonded to form a heat exchanger, such as the heat exchanger 300 of FIG. 3. Alternatively, the interface layer and the manifold layer can be formed from a single monolithic device, in the same process steps. The resulting composite interface and manifold layer can then be bonded with other interface and manifold layers to form a heat exchanger. Next, one or more pumps can be coupled to inlet manifolds in the heat exchanger, which can then be coupled to a heat-generating device. Additionally, the heat-generating device and a bottom surface of the interface layer can be integrally formed during device fabrication.

Similarly, a semiconductor layer can be patterned and etched to form one or more inlet manifolds, one or more outlet manifolds, and an array of projecting fins, as, for example, illustrated in FIG. 10. The resulting heat-sink slice can then be bonded to form a heat exchanger, as described above. One or more pumps can then be coupled to the inlet manifolds in the heat exchanger, which can then be coupled to a heat-generating device.

It will be appreciated that an interface layer in accordance with the present invention can comprise one or more heat-conducting materials such as a semiconductor, molded plastics, materials covered in a metal, porous metals, a silicon foam, or other materials. Preferably, the interface layer comprises a semiconductor such as silicon. The interface layer can also comprise a material that exhibits anisotropic etching so that the interface layer can be fabricated using patterning and anisotropic etching techniques. Materials exhibiting anisotropic etching, which can be used in accordance with the present invention, include, but are not limited to, micro-scale copper tubing and copper filaments. Alternatively, the interface layer can be formed from stamped metal sheets, such as stamped copper sheets, as described below, machined metals, plated metals, and other materials. A manifold layer in accordance with the present invention can be formed from a number of materials including, but not limited to, glass, molded plastics, machined metals, etched metals, or any combination of these materials. Manifold layers can be bonded to interface layers using many techniques including, but not limited to, adhesive bonding, chemical bonding, ultrasonic welding, eutectic bonding, or any combination of these methods.

Figure 11A:
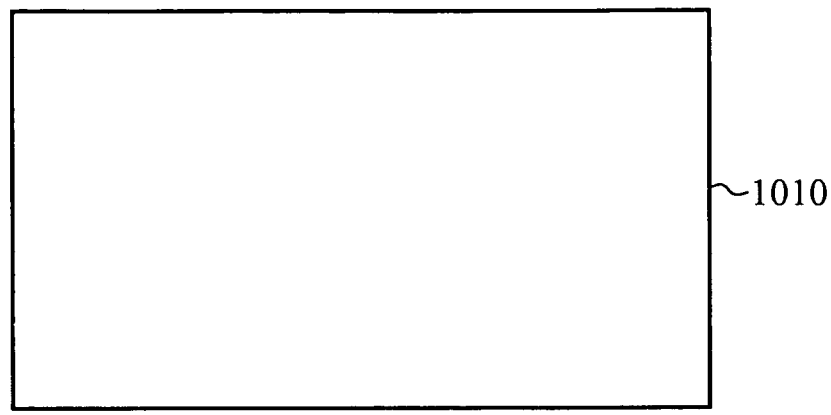
FIGS. 11A–C illustrate steps for forming channels in accordance with one embodiment of the present invention.
Figure 11B:
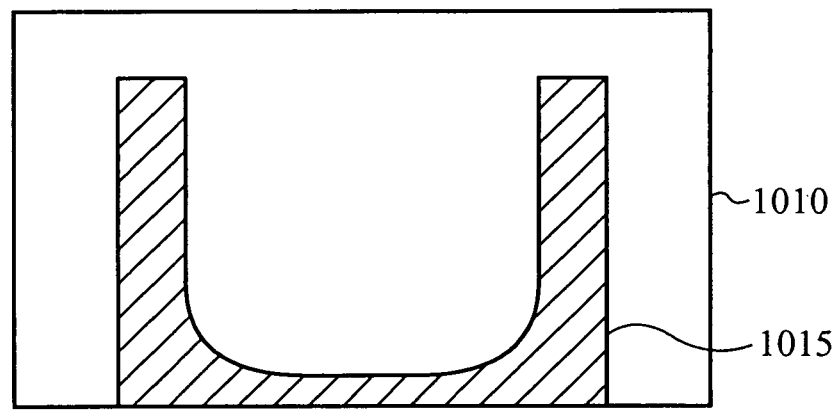
Figure 11C:
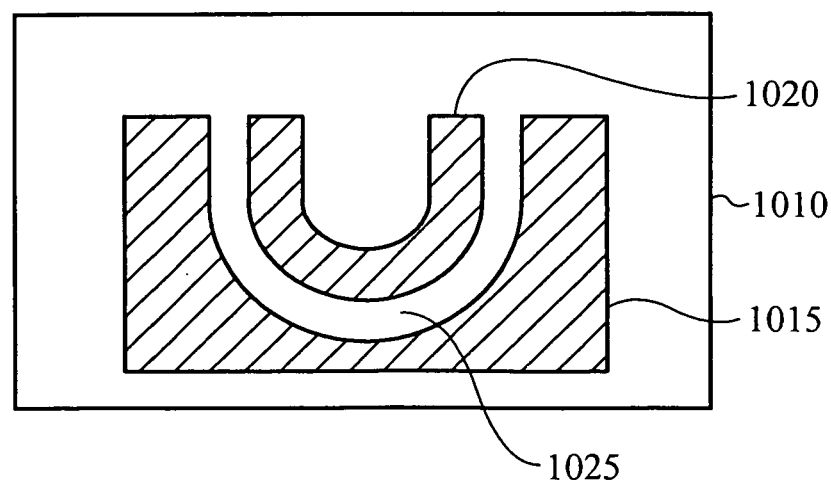

FIGS. 11A–C illustrate a method of forming vertically stacked channels in accordance with the present invention. FIG. 11A shows a sheet of material 1010, such as a stamped sheet of metal. As illustrated in FIG. 11B, a curved section 1015, extending from the sheet of material 1010, is coupled to the sheet of material 1010. The sheet of material 1010 and the curved section 1015 can be coupled using fusion, adhesives, or by other techniques, such as solder and eutectic bonding. Next, as illustrated in FIG. 11C, a curved section 1020 is coupled to the sheet of material 1010, so that the curved sections 1015 and 1020 form a channel 1025. In a similar way, other channels can be formed above the channel 1025 so that a plurality of vertically stacked channels are constructed to form an interface layer in accordance with the present invention.

Figure 12:
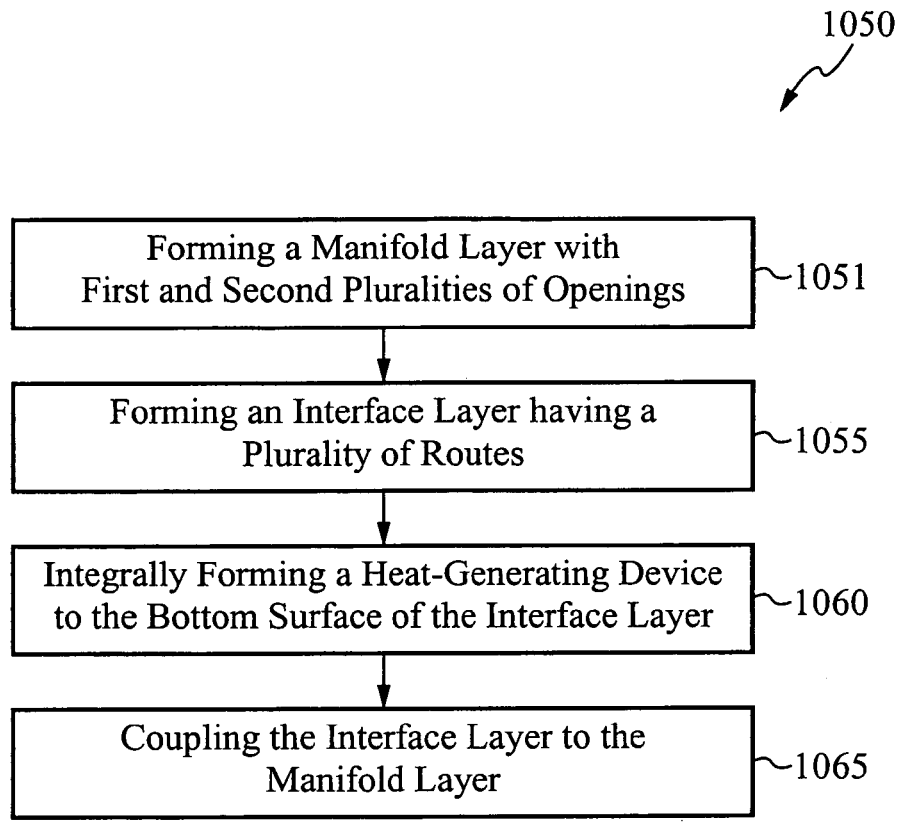
FIG. 12 is a flow chart illustrating the steps for integrally forming a heat-generating device with a bottom surface of an interface layer in accordance with one embodiment of the present invention.

FIG. 12 illustrates steps 1050 for integrally forming a heat-generating device with a bottom surface of an interface layer in accordance with one embodiment of the present invention. In the step 1051, a manifold layer with first and second pluralities of apertures are formed. In the step 1055, an interface layer having a plurality of routes is formed, and in the step 1060, a heat-generating device is integrally formed to the bottom surface of the interface layer. In the step 1065, the interface layer is coupled to the manifold layer.

Figure 13:
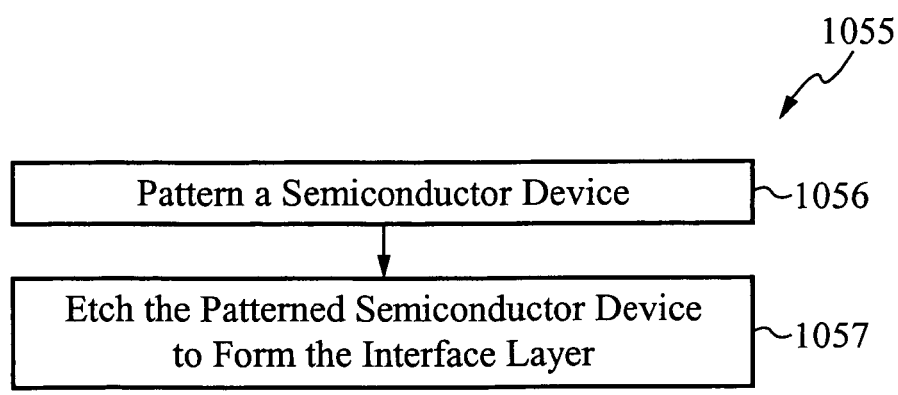
FIG. 13 is a flow chart illustrating the steps for forming the interface layer of FIG. 12.

FIG. 13 illustrates the step 1055 of FIG. 12 in more detail, in accordance with one embodiment of the present invention. As illustrated in FIG. 12, the step 1055 comprises the step 1056 of patterning a semiconductor device and the step 1057 of etching the patterned semiconductor device to form the interface layer.

It will be appreciated that interface layers and manifold layers can be formed and combined in other ways to form vertically stacked channels in accordance with the present invention. For example, channels, manifold inlets, manifold outlets, any array of pin fins, or a combination of these can be formed by stamping a sheet of metal in the shape of the channels, manifold inlets, manifold outlets, or array of pin fins. Alternatively, these structures can be formed using metal injection molding (MIM), plastic injection molding, other forms of molding, or by many other means.

In accordance with the present invention, heat exchangers circulate a cooling material to carry heat from a heat-generating device. Heat exchangers in accordance with the present invention comprise vertically stacked routes containing cooling material used to absorb heat from the heat-generating device and transfer the heat among the vertically-stacked routes, away from the heat-generating device. The routes can have any cross-sectional dimensions configured to carry cooling material to absorb heat from micro devices, such as semiconductor processors, or from larger devices. The cross-sectional dimensions can be configured to fit the application at hand. Such heat exchangers can be used to efficiently cool heat-generating devices such as semiconductor processing devices, motors, light-emitting devices, process chambers, MEMS, and any other devices that generate heat. Many forms of cooling materials can be transmitted through the vertically-stacked channels including, but not limited to, liquids such as water, air, other gases, vapors, refrigerants such as Freon, or any material or combination of materials that can absorb and transport heat efficiently.

The present invention has been described in terms of specific embodiments incorporating details to facilitate the understanding of the principles of construction and operation of the invention. As such, references herein to specific embodiments and details thereof are not intended to limit the scope of the claims appended hereto. It will be apparent to those skilled in the art that modifications can be made to the embodiments chosen for illustration without departing from the spirit and scope of the invention.

We claim:

1. A heat exchanger comprising:
   a. a manifold layer having a first plurality of openings for providing a cooling material to the heat exchanger and a second plurality of openings for removing the cooling material from the heat exchanger;
   b. an interface layer coupled to the manifold layer, the interface layer having a plurality of vertically stacked routes, each route extending from one of the first plurality of openings and terminating at a corresponding one of the second plurality of openings, each route for carrying the cooling material, a cross-section of the plurality of routes substantially contained in a plane non-parallel to a heat-exchanging plane; and
   c. a heat-generating device coupled to a bottom surface of the interface layer.

2. The heat exchanger of claim 1, wherein each route is adjacent to another route, whereby heat can be exchanged between cooling material circulating within adjacent routes.

3. The heat exchanger of claim 2, wherein each route extends from one of the first plurality of openings toward the heat-exchanging plane and then turns to extend away from the heat-exchanging plane toward a corresponding one of the second plurality of openings.

4. The heat exchanger of claim 3, wherein each route is substantially U shaped.

5. The heat exchanger of claim 3, wherein after a route extends from one of the first plurality of openings and before the route extends toward one of the second plurality of openings, the route extends substantially parallel to the heat-exchanging plane.

6. The heat exchanger of claim 1, wherein the interface layer comprises a structural material having a thermal conductivity of at least approximately 20 W/m-K.

7. The heat exchanger of claim 6, wherein the structural material comprises a semiconductor.

8. The heat exchanger of claim 6, wherein the structural material comprises a metal.

9. The heat exchanger of claim 6, wherein the structural material comprises a porous material that defines the plurality of routes.

10. The heat exchanger of claim 9, wherein the porous material comprises a porous metal.

11. The heat exchanger of claim 9, wherein the porous material comprises a silicon foam.

12. The heat exchanger of claim 6, wherein the structural material exhibits anisotropic etching.

13. The heat exchanger of claim 12, wherein the structural material that exhibits anisotropic etching is selected from the group consisting of micro-scale copper tubing and copper filaments.

14. The heat exchanger of claim 6, wherein the structural material comprises a composite of materials.

15. The heat exchanger of claim 1, wherein the cooling material comprises a liquid.

16. The heat exchanger of claim 15, wherein the liquid comprises water.

17. The heat exchanger of claim 1, wherein the cooling material comprises a vapor.

18. The heat exchanger of claim 1, wherein the cooling material comprises a gas.

19. The heat exchanger of claim 1, wherein the cooling material is air.

20. The heat exchanger of claim 1, wherein a cross-section of the first plurality of openings and a cross-section of the second plurality of openings lie substantially in a single plane.

21. A heat exchanger comprising:
   a. a manifold layer having a first plurality of openings for providing a cooling material to the heat exchanger and a second plurality of openings for removing the cooling material from the heat exchanger: and
   b. an interface layer coupled to the manifold layer, the interface layer having a plurality of vertically stacked routes, each route extending from one of the first plurality of openings and terminating at a corresponding one of the second plurality of openings, each route for carrying the cooling material, a cross-section of the plurality of routes substantially contained in a plane non-parallel to a heat-exchanging plane; and
   c. a heat insulator between the first plurality of openings and the second plurality of openings.

22. The heat exchanger of claim 21, wherein the heat insulator comprises an air gap.

23. The heat exchanger of claim 21, wherein the heat insulator comprises a vacuum gap.

24. The heat exchanger of claim 21, wherein the heat insulator comprises an insulating material having a thermal conductivity of approximately 5 W/m-K or less.

25. The heat exchanger of claim 1, wherein a cross-sectional dimension of a route changes as it extends from one of the first plurality of openings to one of a second plurality of openings.

26. The heat exchanger of claim 25, wherein a cross-sectional dimension of a route increases uniformly as it extends from one of the first plurality of openings to a corresponding one of the second plurality of openings.

27. The heat exchanger of claim 1, wherein the heat-generating device is formed integrally with the bottom surface of the interface layer.

28. The heat exchanger of claim 1, wherein the heat-generating device is a semiconductor device.

29. The heat exchanger of claim 1, wherein each route comprises a channel.

30. The heat exchanger of claim 1, wherein the plurality of routes is defined by a plurality of pin fins.

31. The heat exchanger of claim 30, wherein the plurality of pin fins are positioned cross-wise to the plurality of routes.

32. The heat exchanger of claim 1, further comprising a pump coupled to the first plurality of openings.

33. The heat exchanger of claim 1, wherein the manifold layer and the interface layer form a monolithic device.

34. A method of forming a heat exchanger comprising:
   a. forming a manifold layer having a first plurality of openings for providing a cooling material to the heat exchanger and a second plurality of openings for removing the cooling material from the heat exchanger;
   b. forming an interface layer coupled to the manifold layer, the interface layer having a plurality of vertically stacked routes that each extends from one of the first plurality of openings and terminates at a corresponding one of the second plurality of openings, each route for carrying the cooling material, a cross-section of the plurality of routes substantially contained in a plane non-parallel to a heat-exchanging plane; and
   c. coupling a heat-generating device to a bottom surface of the interface layer.

35. The method of claim 34, wherein each route is adjacent to another route.

36. The method of claim 34, wherein each route extends from one of the first plurality of openings toward the heat-exchanging plane and then turns to extend away from the heat-exchanging plane toward a corresponding one of the second plurality of openings.

37. The method of claim 36, wherein each route is substantially U shaped.

38. The method of claim 36, wherein after a route extends from one of the first plurality of openings and before the route extends toward one of the second plurality of openings, the route extends substantially parallel to the heat-exchanging plane.

39. The method of claim 34, wherein the interface layer comprises a structural material having a thermal conductivity of at least approximately 20 W/m-K.

40. The method of claim 39, wherein the structural material comprises a semiconductor.

41. The method of claim 39, wherein the structural material comprises a metal.

42. The method of claim 39, wherein the structural material comprises a porous material defining the plurality of routes.

43. The method of claim 42, wherein the porous material comprises a porous metal.

44. The method of claim 42, wherein the porous material comprises a silicon foam.

45. The method of claim 39, wherein the structural material exhibits anisotropic etching.

46. The method of claim 45, wherein the structural material exhibiting anisotropic etching is selected from the group consisting of micro-scale copper tubing and copper filaments.

47. The method of claim 39, wherein the structural material comprises a composite of materials.

48. The method of claim 34, wherein a cross-section of the first plurality of openings and a cross-section of the second plurality of openings lie substantially in a single plane.

49. A method of forming a heat exchanger comprising:
   a. forming a manifold layer having a first plurality of openings for providing a cooling material to the heat exchanger and a second plurality of openings for removing the cooling material from the heat exchanger;
   b. forming an interface layer coupled to the manifold layer, the interface layer having a plurality of vertically stacked routes that each extends from one of the first plurality of openings and terminates at a corresponding one of the second plurality of openings, each route for carrying the cooling material, a cross-section of the plurality of routes substantially contained in a plane non-parallel to a heat-exchanging plane; and
   c. forming a heat insulator between the first plurality of openings and the second plurality of openings.

50. The method of claim 49, wherein the heat insulator comprises an air gap.

51. The method of claim 49, wherein the heat insulator comprises a vacuum gap.

52. The method of claim 49, wherein the heat insulator comprises a material having a thermal conductivity of approximately 5 W/m-K or less.

53. The method of claim 34, wherein a cross-sectional dimension of a route changes as it extends from one of the first plurality of openings to a corresponding one of the second plurality of openings.

54. The method of claim 53, wherein a cross-sectional dimension of a route increases uniformly as it extends from one of the first plurality of openings to a corresponding one of a second plurality of openings.

55. The method of claim 34, wherein coupling a heat-generating device to a bottom surface of the interface layer comprises integrally forming the heat-generating device to the bottom surface of the interface layer.

56. The method of claim 55, wherein the heat-generating device is a semiconductor device.

57. The method of claim 34, wherein each route comprises a channel.

58. The method of claim 34, wherein each route is defined by a plurality of pin fins.

59. The method of claim 58, wherein the plurality of pin fins are positioned crosswise to the plurality of routes.

60. The method of claim 34, wherein the manifold layer and the interface layer form a monolithic device.

61. The method of claim 34, wherein the step of forming an interface layer comprises patterning a semiconductor device and etching the patterned semiconductor device to form the interface layer.

62. The method of claim 34, wherein the step of forming an interface layer comprises stamping a sheet of metal in the shape of the plurality of routes.

63. The method of claim 34, wherein the step of forming an interface layer comprises injection molding a metal in the shape of the plurality of routes.

64. A method of cooling a device comprising transmitting a cooling material from an inlet manifold, through a plurality of stacked routes positioned over the device, and to an outlet manifold.

65. The method of claim 64, wherein the stacked routes comprise a structural material having a thermal conductivity of at least approximately 20 W/m-K.

66. The method of claim 65, wherein the structural material comprises a semiconductor.

67. The method of claim 65, wherein the structural material comprises a metal.

68. The method of claim 65, wherein the structural material comprises a porous material that defines the plurality of stacked routes.

69. The method of claim 68, wherein the porous material comprises a porous metal.

70. The method of claim 68, wherein the porous material comprises a silicon foam.

71. The method of claim 65, wherein the structural material exhibits anisotropic etching.

72. The method of claim 71, wherein the structural material exhibiting anisotropic etching comprises a material selected from the group consisting of micro-scale copper tubing and copper filaments.

73. The method of claim 65, wherein the structural material comprises a composite of materials.

74. The method of claim 64, wherein the plurality of stacked routes comprises pin fins.

75. The method of claim 64, wherein the cooling material comprises a liquid.

76. The method of claim 75, wherein the liquid is water.

77. The method of claim 64, wherein the cooling material comprises a vapor.

78. The method of claim 64, wherein the cooling material comprises a gas.

79. The method of claim 64, wherein the cooling material is air.

* * * * *